(12) United States Patent
Hirabayashi et al.

(10) Patent No.: US 6,861,010 B2
(45) Date of Patent: Mar. 1, 2005

(54) COPPER-BASED METAL POLISHING COMPOSITION, METHOD FOR MANUFACTURING A SEMICONDUCTOR DEVICE, POLISHING COMPOSITION, ALUMINUM-BASED METAL POLISHING COMPOSITION, AND TUNGSTEN-BASED METAL POLISHING COMPOSITION

(75) Inventors: Hideaki Hirabayashi, Oota-ku (JP); Naoaki Sakurai, Yokohama (JP); Toshitsura Cho, Kawasaki (JP); Shumpei Shimizu, Kawasaki (JP); Katsuhiro Kato, Kawasaki (JP); Akiko Saito, Yokohama (JP)

(73) Assignees: Kabushiki Kaisha Toshiba, Kawasaki (JP); Tama Chemicals Co., Ltd., Kawasaki (JP)

(*) Notice: Subject to any disclaimer, the term of this patent is extended or adjusted under 35 U.S.C. 154(b) by 86 days.

(21) Appl. No.: 10/124,423

(22) Filed: Apr. 18, 2002

(65) Prior Publication Data

US 2002/0160608 A1 Oct. 31, 2002

Related U.S. Application Data

(62) Division of application No. 09/410,744, filed on Oct. 1, 1999, now Pat. No. 6,426,294.

(30) Foreign Application Priority Data

Oct. 7, 1998 (JP) .......................... 10-285218
Aug. 25, 1999 (JP) .......................... 11-238767

(51) Int. Cl.$^7$ ...................... C09K 13/00; C09K 13/06; H01L 21/302
(52) U.S. Cl. ...................... 252/79.1; 252/79.4; 438/692
(58) Field of Search .............................. 252/79.1, 79.4; 438/692

(56) References Cited

U.S. PATENT DOCUMENTS

| | | | |
|---|---|---|---|
| 4,954,142 A | 9/1990 | Carr et al. ...................... 51/309 |
| 4,956,313 A | 9/1990 | Cote et al. ................... 437/203 |
| 5,391,258 A | 2/1995 | Brancaleoni et al. ........ 156/636 |
| 5,575,885 A | 11/1996 | Hirabayashi et al. ..... 156/626.1 |
| 5,637,185 A * | 6/1997 | Murarka et al. ................ 438/5 |
| 5,755,614 A * | 5/1998 | Adams et al. ................. 451/60 |
| 5,770,095 A | 6/1998 | Sasaki et al. .................. 216/38 |
| 5,783,489 A * | 7/1998 | Kaufman et al. ............ 438/692 |
| 5,800,577 A | 9/1998 | Kido ........................... 51/307 |
| 5,934,978 A * | 8/1999 | Burke et al. ................... 451/36 |
| 5,954,997 A * | 9/1999 | Kaufman et al. ........... 252/79.1 |
| 6,046,110 A | 4/2000 | Hirabayashi et al. ........ 438/690 |
| 6,082,373 A * | 7/2000 | Sakurai et al. ................... 134/1 |
| 6,083,419 A * | 7/2000 | Grumbine et al. .......... 252/79.1 |
| 6,117,775 A | 9/2000 | Kondo et al. .................. 51/307 |
| 6,139,763 A | 10/2000 | Ina et al. ....................... 216/89 |
| 6,177,026 B1 | 1/2001 | Wang et al. ................ 252/79.1 |
| RE37,786 E | 7/2002 | Hirabayashi et al. .......... 438/14 |
| 6,521,574 B1 | 2/2003 | Hirabayashi et al. ........ 510/175 |
| 6,653,267 B2 * | 11/2003 | Yano et al. .................. 510/254 |

FOREIGN PATENT DOCUMENTS

JP 9-55363 2/1997
JP 10-44047 2/1998

* cited by examiner

*Primary Examiner*—Nadine G. Norton
*Assistant Examiner*—Lynette T. Umez-Eronini
(74) *Attorney, Agent, or Firm*—Oblon, Spivak, McClelland, Maier & Neustadt, P.C.

(57) ABSTRACT

The copper-based metal polishing composition causes Cu or Cu alloy not to be dissolved at all in immersing Cu or Cu alloy therein, and makes it possible to polish Cu or Cu alloy at a high rate in polishing treatment. Such a copper-based metal polishing composition comprises a water-soluble first organic acid capable of reaction with copper to produce a copper complex compound which is substantially insoluble in water and has a mechanical strength lower than that of copper, at least one second organic acid selected from an organic acid having a single carboxyl group and a single hydroxyl group and oxalic acid, an abrasive grain, an oxidizing agent, and water.

7 Claims, 17 Drawing Sheets

COPPER-BASED METAL POLISHING COMPOSITION, METHOD FOR MANUFACTURING A SEMICONDUCTOR DEVICE, POLISHING COMPOSITION, ALUMINUM-BASED METAL POLISHING COMPOSITION, AND TUNGSTEN-BASED METAL POLISHING COMPOSITION

This application is a Division of application Ser. No. 09/410,744 filed on Oct. 1, 1999, now U.S. Pat. No. 6,426,294.

BACKGROUND OF THE INVENTION

The present invention relates to a copper-based polishing composition, a method for manufacturing a semiconductor device, a polishing composition, an aluminum-based metal polishing composition, and a tungsten-based metal polishing composition.

In the step of forming a wiring layer, which is one step in the process for manufacturing a semiconductor device, etch back technique is adopted for the purpose of overcoming the difference in level of its surface. This etch back technique is a manner of forming a trench in a form of wiring in an insulating film on a semiconductor substrate, depositing a Cu film on the insulating film including the trench, using a polishing machine and a polishing composition to polish the Cu film, thereby causing the Cu film to remain only inside the trench to form an embedded wiring layer.

Incidentally, as the polishing composition, hitherto a composition wherein an abrasive grain such as colloidal silica is dispersed into pure water has been used. However, in the case in which the Cu film deposited on the substrate is polished by supplying the polishing composition to a polishing pad of a polishing machine and simultaneously applying a predetermined load to the polishing pad, mechanical polishing caused by the abrasive grain and the polishing pad is merely applied to the Cu film. For this reason, there arises a problem that the polishing rate is low, that is, 10 nm/minute.

On the other hand, J. Electrochem. Soc., Vol. 138. No. 11. 3460 (1991), VMIC Conference, ISMIC-101/92/0156 (1992) or VMIC Conference, ISMIC-102/93/0205 (1993) discloses a composition for polishing a Cu film or a Cu alloy film, comprising a slurry of amine-type colloidal silica, or a slurry wherein $K_3Fe(CN)_6$, $K_4(CN)_6$ or $CO(NO_3)_2$ is added.

However, concerning the aforementioned polishing composition, there is no difference in a rate of etching a Cu film between the step of immersing and the step of polishing. Consequently, if a Cu wiring layer inside the trench contacts the polishing composition after the aforementioned etch back step, the Cu wiring layer is further etched by the polishing composition because there is no difference in the rate of etching the Cu film between the step of immersing and the step of polishing. Therefore, the surface level of the Cu wiring layer inside the trenches becomes lower than the surface of the insulating film. Thus, it becomes difficult that the wiring layer having the same level as the surface of the insulating film is formed, so that its flatness is damaged. Moreover, the embedded Cu wiring layer thus formed has a higher resistance than the Cu wiring layer embedded so as to have the same level as the insulating film surface.

Jpn. Pat. Appln. KOKAI Publication No. 10-44047 describes a polishing slurry, comprising an aqueous medium, an abrasive, an oxidizing agent such as a peroxide, and an organic acid such as lactic acid. The oxidizing agent in this polishing slurry has a function of oxidizing a layer of a metal such as copper on an insulating film to heighten a removing rate in mechanical polishing, and the organic acid has a function of heightening selectivity about the polishing rate of the oxidizing agent.

Jpn. Pat. Appln. KOKAI Publication No. 9-55363 discloses a copper-based metal polishing composition comprising a water-soluble organic acid, such as 2-quinoline carboxylic acid, that is a capable of reaction with copper to produce a copper complex compound which is substantially insoluble in water and has a mechanical strength lower than that of copper; an abrasive grain; an oxidizing agent; and water.

BRIEF SUMMARY OF THE INVENTION

An object of the present invention is to provide a copper-based metal polishing composition having an increased rate of polishing copper (Cu) or copper alloy (Cu alloy) by improving the copper-based metal polishing composition disclosed in Jpn. Pat. Appln. KOKAI Publication No. 9-55363 described above.

Another object of the present invention is to provide a method for manufacturing a semiconductor device which makes it possible to form at least one member for embedment selected from a trench and an opening in an insulating film on a semiconductor substrate and then subject a conductive material film comprising copper (Cu) or Copper alloy (Cu alloy) formed on the insulating film to etch back treatment for a short time and further to form a conductive member such as an embedded wiring layer having the same level as the surface of the insulating film and exhibiting high accuracy.

Still another object of the present invention is to provide a polishing composition making it possible to polish a metal film, and suppress generation of injuries on the polished surface.

A further object of the present invention is to provide a polishing composition making it possible to polish a metal film comprising Cu or the like at a practical rate, and suppress generation of injuries on the polished surface.

An additional object of the present invention is to provide a method for manufacturing a semiconductor device which makes it possible to form at least one member for embedment selected from a trench and an opening in an insulating film on a semiconductor substrate and then subject a conductive material film comprising copper (Cu) or Copper alloy (Cu alloy) formed on the insulating film to etch back treatment for a short time and further to form a conductive member such as an embedded wiring layer having the same level as the surface of the insulating film, exhibiting high accuracy and causing generation of injuries on its polished surface to be suppressed.

An additional object of the present invention is to provide a method for manufacturing a semiconductor device which makes it possible to form a wiring layer which can be etched back for a short time and has a dual damascene structure with a high precision by making a trench and an opening in an insulating film on a semiconductor substrate, depositing a conductive material film comprising copper (Cu) or copper alloy (Cu alloy) on the insulating film, and subsequently performing polishing.

An additional object of the present invention is to provide a method for manufacturing a semiconductor device which makes it possible to form a high-precision multilayer wiring composed mainly of copper by etch back for a short time.

According to the present invention, provided is a copper-based metal polishing composition, comprising a water-soluble first organic acid capable of reaction with copper to produce a copper complex compound which is substantially insoluble in water and has a mechanical strength lower than that of copper; at least one second organic acid selected from an organic acid having a single carboxyl group and a single hydroxyl group and oxalic acid; an abrasive grain; an oxidizing agent; and water.

Also, according to the present invention, provided is a method for manufacturing a semiconductor device, comprising the steps of:

forming at least one member for embedment selected from an opening corresponding to a shape of a via fill and a trench corresponding to a shape of a wiring layer in an insulating film on a semiconductor substrate;

forming a conductive material film comprising copper or copper alloy on the insulating film including the member; and polishing the conductive material film by using a polishing composition comprising a water-soluble first organic acid capable of reaction with copper to produce a copper complex compound which is substantially insoluble in water and has a mechanical strength lower than that of copper, at least one second organic acid selected from an organic acid having a single carboxyl group and a single hydroxyl group and oxalic acid, an abrasive grain, an oxidizing agent and water, thereby forming at least one conductive member selected from a wiring layer and a via fill in the member for embedment.

Furthermore, according to the present invention, provided is a polishing composition, comprising colloidal alumina and water.

Furthermore, according to the present invention, is provided is a copper-based metal polishing composition comprising a water-soluble organic acid capable of reaction with copper to produce a copper complex compound which is substantially insoluble in water and has a mechanical strength lower than that of copper; an oxidizing agent; colloidal alumina and water.

Additionally, according to the present invention, provided is a method for manufacturing a semiconductor device, comprising the steps of:

forming at least one member for embedment selected from an opening corresponding to a shape of a via fill and a trench corresponding to a shape of a wiring layer in an insulating film on a semiconductor substrate;

forming a conductive material film comprising copper or copper alloy on the insulating film including the member; and polishing the conductive material film by using a polishing composition comprising a water-soluble organic acid capable of reaction with copper to produce a copper complex compound which is substantially insoluble in water and has a mechanical strength lower than that of copper, an oxidizing agent, colloidal alumina and water, thereby forming at least one conductive member selected from a wiring layer and a via fill in the member for embedment.

Moreover, according to the present invention, provided is an aluminum-based metal polishing composition, comprising at least one polishing promoter selected from trimethyl ammonium hydroxide, trimethyl hydroxide, a mixed acid of phosphoric acid, sulfuric acid and acetic acid, and ferric chloride; an oxidizing agent; colloidal alumina; and water.

Besides, according to the present invention, provided is a tungsten-based metal polishing composition, comprising at least one polishing promoter selected from ferric chloride and ferric nitrate; an oxidizing agent; colloidal alumina; and water.

Furthermore, according to the present invention, provided is a method for manufacturing a semiconductor device, comprising the steps of:

forming a trench corresponding to a shape of a wiring layer in an insulating film on a semiconductor substrate, and forming an opening reached to a surface of the semiconductor substrate in the insulating film portion which is positioned at a part of the bottom of the trench;

forming a conductive material film comprising copper or copper alloy on the insulating film including the trench and the opening; and polishing the conductive material film by using a polishing composition comprising a water-soluble first organic acid capable of reaction with copper to produce a copper complex compound which is substantially insoluble in water and has a mechanical strength lower than that of copper, at least one second organic acid selected from an organic acid having a single carboxyl group and a single hydroxyl group and oxalic acid, an abrasive grain, an oxidizing agent, and water, thereby forming wiring having a dual damascene structure in the opening and trench.

Furthermore, according to the present invention, provided is a method for manufacturing a semiconductor device, comprising the steps of:

forming at least a first opening corresponding to a shape of a first via fill in a first insulating film on a semiconductor substrate, forming a first conductive material film comprising copper or copper alloy on the first insulating film including the opening;

polishing the first conductive material film by using a polishing composition comprising a water-soluble first organic acid capable of reaction with copper to produce a copper complex compound which is substantially insoluble in water and has a mechanical strength lower than that of copper, at least one second organic acid selected from an organic acid having a single carboxyl group and a single hydroxyl group and oxalic acid, an abrasive grain, an oxidizing agent, and water, thereby forming the first via fill in the first opening;

forming a second insulating film on the first insulating film including the first via fill;

forming a second opening corresponding to a shape of a second via fill reached to at least the first via fill in the second insulating film;

forming a second conductive material film comprising copper or copper alloy on the second insulating film including the second opening; and polishing the second conductive material film by using a second polishing composition comprising a water-soluble first organic acid capable of reaction with copper to produce a copper complex compound which is substantially insoluble in water and has a mechanical strength lower than that of copper, at least one second organic acid selected from an organic acid having a single carboxyl group and a single hydroxyl group and oxalic acid, an abrasive grain, an oxidizing agent, and water, thereby forming the second via fill in the second opening.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The copper-based polishing composition according to the present invention will be specifically described hereinafter.

This copper-based polishing composition comprises a water-soluble first organic acid capable of reaction with copper to produce a copper complex compound which is substantially insoluble in water and has a mechanical strength lower than that of copper, at least one second organic acid selected from an organic acid having a single carboxyl group and a single hydroxyl group and oxalic acid, an abrasive grain, an oxidizing agent and water.

The first organic acid has, when the polishing composition is brought into contact with copper or copper alloy, a function of reacting with a copper hydrate generated by the oxidizing agent to produce a copper complex compound which is substantially insoluble in water and has a mechanical strength lower than that of Cu. Such a first organic acid may be, for example, 2-quinoline carboxylic acid (quinaldinic acid), 2-pyridine carboxylic acid, 2,6-pyridine carboxylic acid, and quinone.

It is preferred that the first organic acid is contained in an amount of 0.1% or more by weight in the polishing composition. If the first organic acid content is less than 0.1% by weight, it becomes difficult to sufficiently produce the copper complex compound having a mechanical strength lower than that of copper on the surface of Cu or Cu alloy. As a result, it becomes difficult to heighten the polishing rate of Cu or Cu alloy sufficiently in polishing. The first organic acid content is more preferably from 0.3 to 1.2% by weight.

The second organic acid has a function of promoting production of the copper hydrate by the oxidizing agent. The second organic acid (the organic acid having a single carboxyl group and a single hydroxyl group) may be, for example, lactic acid, tartaric acid, mandelic acid, or malic acid. A single or a mixture of two or more kinds thereof may be used. As the second organic acid, lactic acid is especially preferred.

In the polishing composition, it is preferred that the second organic acid is contained in an amount of 20 to 250% by weight of the first organic acid. If the second organic acid content is less than 20% by weight, it becomes difficult to sufficiently exhibit the function of promoting production of the copper hydrate by the oxidizing agent. On the other hand, if the second organic acid content is more 250% by weight, the copper film is etched and thus it is feared that a desired pattern is not formed. The second organic acid content is more preferably from 40 to 200% by weight of the first organic acid.

The abrasive grain is made of at least one material from silica, zirconia, cerium oxide, and alumina.

Figure 1:
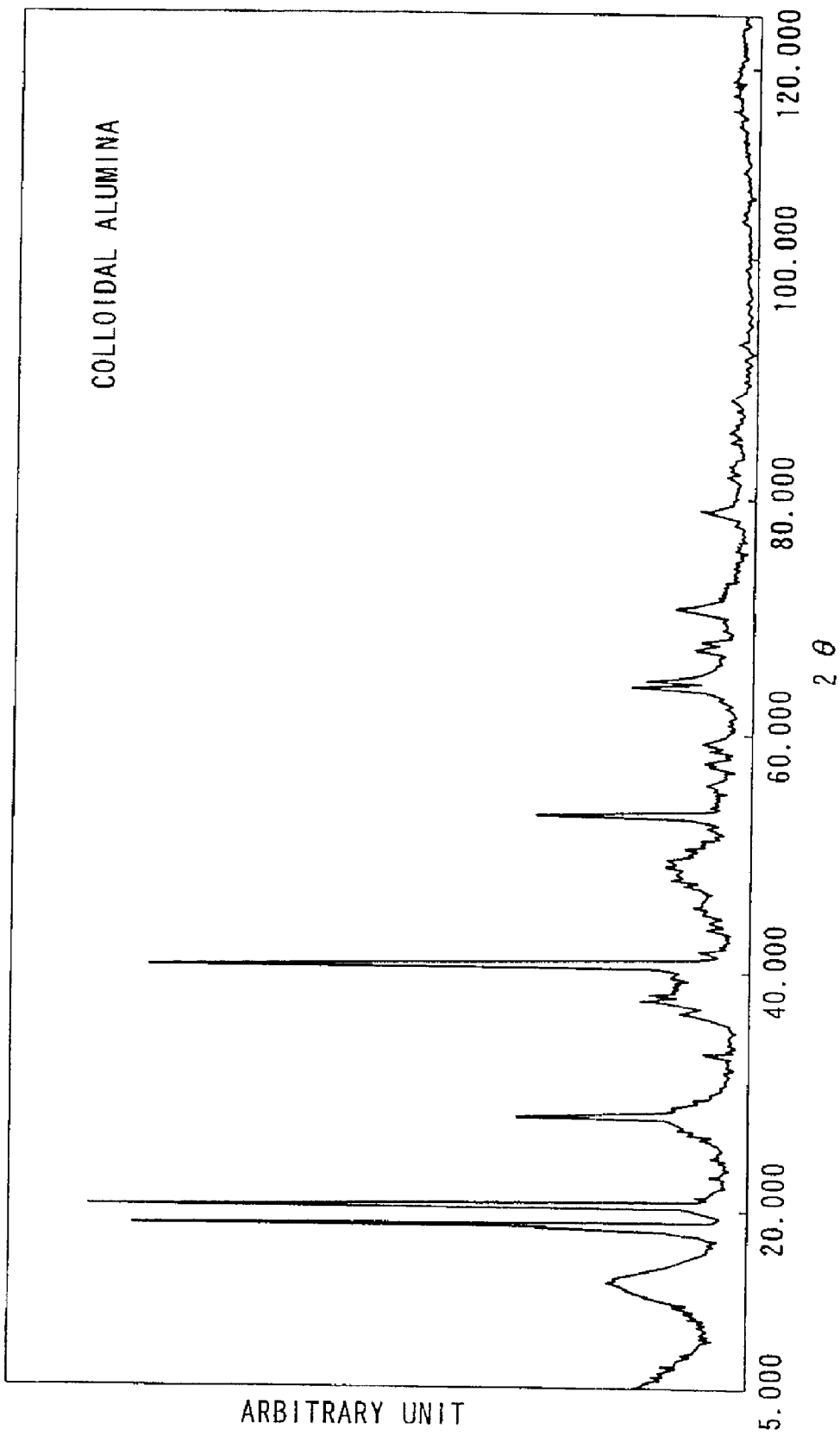
FIG. 1 shows an X-ray diffraction spectrum of colloidal alumina.
Figure 2:
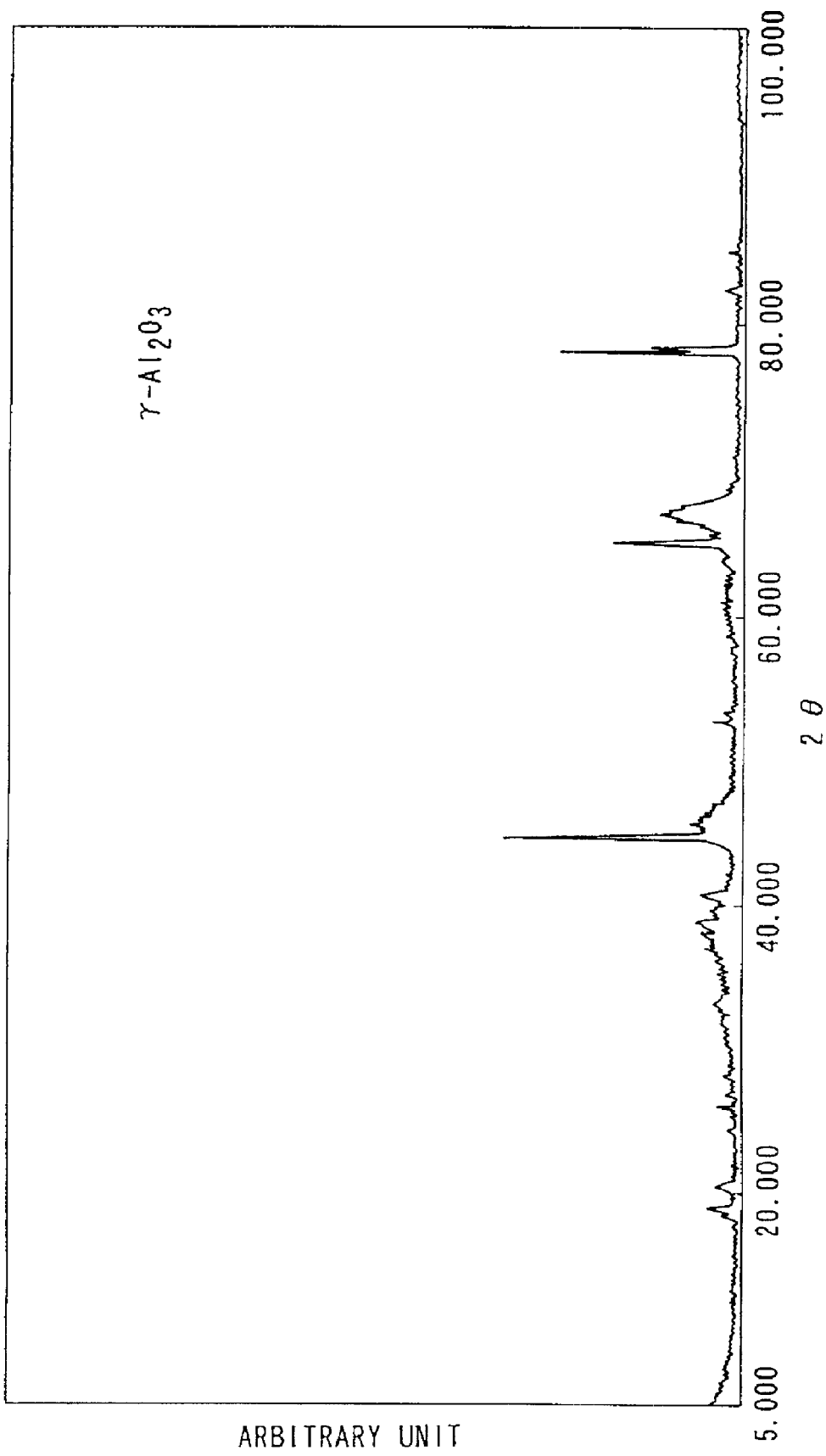
FIG. 2 shows an X-ray diffraction spectrum of γ-alumina.

It is especially preferred that the abrasive grain is colloidal alumina alone, or mixed particles of colloidal alumina and silica particles, such as colloidal silica. Such a polishing composition containing colloidal alumina as an abrasive grain makes it possible to suppress damage of the polished surface of copper or copper alloy. The colloidal alumina can be obtained by dissolving aluminum alkoxide such as aluminum triisopropoxide into an organic solvent, adding pure water thereto so as to cause hydrolysis, and drying the hydrolyzed material. X-ray diffraction spectra of the resultant colloidal alumina and γ-alumina are shown in FIGS. 1 and 2.

Preferably, the abrasive grain has an average primary particle size of 0.02 to 0.1 μm, and has a spherical or substantially spherical shape. When the polishing composition containing such an abrasive grain is used to polish Cu or Cu alloy, it is possible to suppress damage of the polished surface of Cu or Cu alloy.

It is preferred that the abrasive grain is contained in an amount of 1 to 20% by weight in the polishing composition. If the abrasive grain content is less 1% by weight, it becomes difficult to attain its effect sufficiently. On the other hand, if the abrasive grain content is more than 20% by weight, handling thereof becomes difficult, for example, because the viscosity of the polishing composition becomes high. The abrasive grain content is more preferably from 2 to 10% by weight in the polishing composition.

The oxidizing agent has a function of causing production of a copper hydrate when the polishing composition is brought into contact with copper or copper alloy. As such an oxidizing agent, an oxidizing agent such as hydrogen peroxide ($H2O2$) or sodium hypochlorite (NaClO) can be used.

It is preferred that in the polishing composition the oxidizing agent is contained 10 time or more by weight as large as the first organic acid. If the oxidizing agent content is less than 10 times by weight as large as the first organic acid, it becomes difficult to promote production of a copper complex compound sufficiently on the surface of Cu or Cu alloy. The oxidizing agent content is more preferably 30 times or more and most preferably 50 times or more by weight as large as the first organic acid.

Additionally, a non-ionic, amphoteric, cationic, or anionic surfactant may be added into the polishing composition according to the present invention. The polishing composition containing such a surfactant makes it possible to heighten capability of selectively etching Cu or Cu alloy, and insulating films such as SiN and $SiO_2$ films.

Examples of the non-ionic surfactant include polyethyleneglycol phenyl ether, and ethyleneglycol fatty ester.

Examples of the amphoteric surfactant include imidazolybetaine.

Examples of the cationic surfactant include sodium dodecyl sulphate.

Examples of the anionic surfactant include stearic trimethyl ammonium chloride.

The aforementioned surfactants may be used in a form of a mixture of two or more kinds.

It is preferred that the surfactant is added into the polishing composition in an amount of 1 mole/liter or more. If the added amount of the surfactant is less than 1 mole/liter, it becomes difficult to heighten capability of selectively polishing Cu or Cu alloy, and an insulating film such as $SiO_2$. The surfactant content is more preferably from 10 to 100 mole/liter.

The polishing composition according to the present invention may further contain a dispersing agent for the abrasive grain. Examples of this dispersing agent include polyvinylpyrrolidone (PVP).

Figure 3:
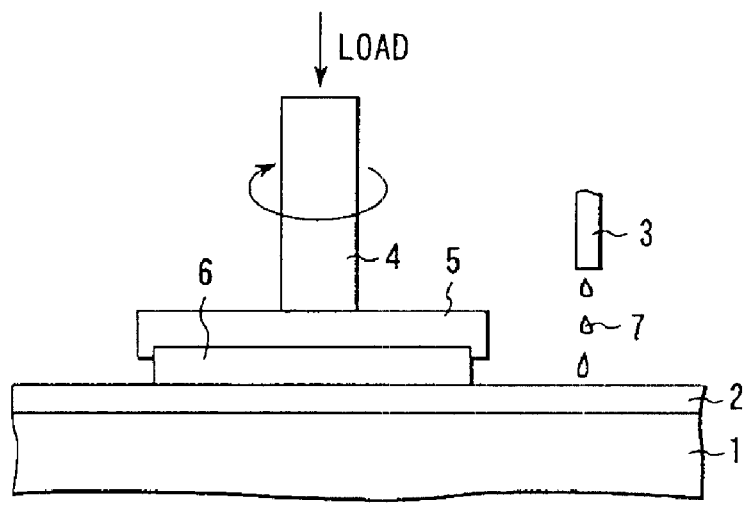
FIG. 3 is a schematic view illustrating a polishing machine used in the polishing step according to the present invention.

In order to use the copper-based metal polishing composition according to the present invention to polish, for example, a Cu film or a Cu alloy film formed on a substrate, a polishing machine shown in FIG. 3 is used. That is, in this machine, a turn table 1 is covered with a polishing pad 2 made of, for example, cloth. A supplying tube 3 for supplying the polishing composition is arranged above the polishing pad 2. A substrate holder 5 having on its upper face a supporting axial 4 is arranged above the polishing pad 2 to go up and down freely and rotate freely.

In such a polishing machine, a substrate 6 is held by the holder 5 so that its polishing surface (for example, a Cu film) opposes the polishing pad 2. While a polishing composition 7 having the aforementioned components is supplied from the supplying tube 3, a desired load is applied to the polishing pad 2 by pushing the substrate 6 through the supporting axial 4. Furthermore, the holder 5 and the turn table 1 are rotated in the same direction, so that the Cu film on the substrate is polished.

The copper-based metal polishing composition according to the present invention, described above, comprises the water-soluble first organic acid capable of reaction with copper to produce a copper complex compound which is substantially insoluble in water and has a mechanical strength lower than that of copper, at least one second organic acid selected from an organic acid having a single carboxyl group and a single hydroxyl group and oxalic acid, the abrasive grain, the oxidizing agent and water. Therefore, in immersing Cu or Cu alloy therein, Cu or Cu alloy is not dissolved at all therein, and in polishing, Cu or the Cu alloy can be polished at a practical rate. The practical rate herein means a rate 60 times or more as large as the rate in case of using the polishing composition containing only a conventional abrasive grain.

Figure 4A:
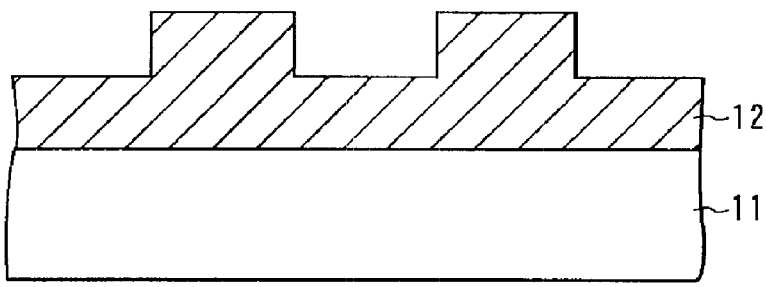
FIGS. 4A to 4C are cross sections illustrating the step of treating a Cu film having unevenness with a copper-based metal polishing composition of the present invention.

That is, when a Cu film 12 having unevenness on a substrate 11 as shown in, for example, FIG. 4A is formed and then the substrate 11 is immersed into a copper-based polishing composition which is beforehand prepared and comprises the first organic acid (for example, 2-quinoline carboxylic acid), the second organic acid (for example, lactic acid), the oxidizing agent (for example, hydrogen peroxide), the abrasive grain and water, the oxidizing agent in the composition is reacted with copper in the presence of water to a copper hydrate (Cu ion). At this time, by incorporating the second organic acid (for example, lactic acid) into the polishing composition, the production of the hydrate can be promoted. Moreover, the first organic acid (for example, 2-quinoline carboxylic acid) in the polishing composition is reacted the copper hydrate (Cu ion) shown in a below reaction formula to produce a copper complex layer 13 on the Cu film 12 as shown in FIG. 4B.

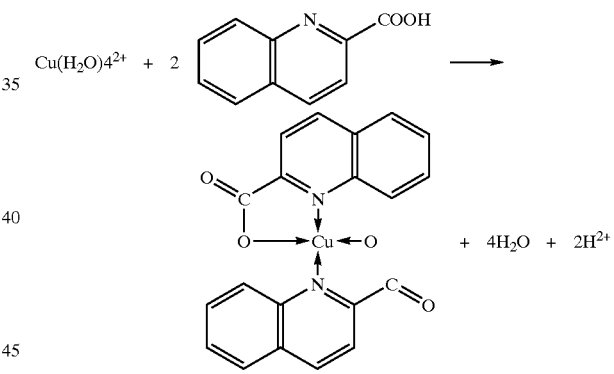

Figure 4B:
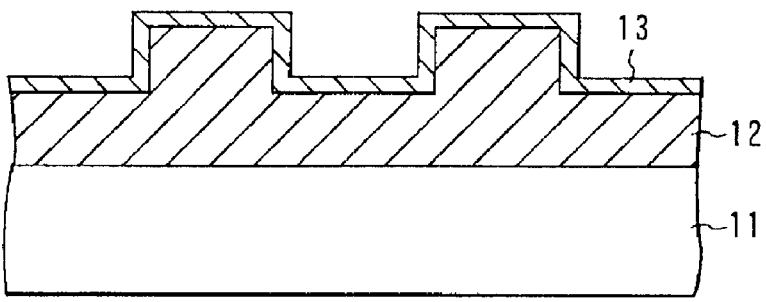
Figure 4C:
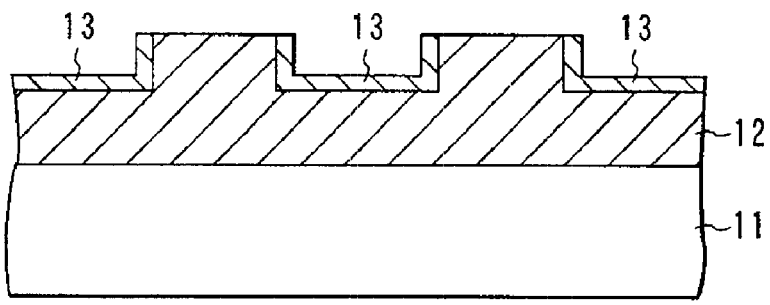

Next, the polishing machine shown in FIG. 3 and the polishing composition are used to hold the Cu film 12 having on its surface the produced copper complex layer 13 upside down onto the substrate holder 5 shown in FIG. 4B in such a manner that the Cu film 12 opposes the polishing pad 2. Subsequently, the substrate is pressed by the supporting axial 4 to apply a predetermined load to the polishing pad 2. Furthermore, while the holder 5 and the turn table 1 are rotated in the same direction, the polishing composition is supplied from the supplying tube 3 to the polishing pad 2. At this time, the copper complex layer 13 produced on the surface of Cu or Cu alloy by the aforementioned reaction formula is not dissolved into water, but has a mechanical strength lower than that of Cu. Thus, the copper complex layer 13 corresponding to convex portions of the Cu film 12 as shown in FIG. 4C is mechanically polished by the polishing composition containing the abrasive grain existing on the polishing pad 2.

According to the polishing composition of the present invention, therefore, when the copper complex compound which has a mechanical strength lower than that of Cu is produced on the surface of Cu or Cu alloy from the first organic acid and the copper hydrate in accordance with the aforementioned reaction formula, incorporation of the second organic acid such as lactic acid causes promotion of the hydrate by the oxidizing agent and, in consequence, makes it possible to promote production of the brittle copper complex compound which is polished in the presence of the polishing composition containing the abrasive grain. For this reason, Cu or Cu alloy can be polished at a far higher speed than by polishing compositions containing only a conventional abrasive grain, or polishing compositions containing the first organic acid such as 2-quinoline carboxylic acid, an oxidizing agent and an abrasive grain.

Moreover, the polishing composition of the present invention, when Cu or Cu alloy is immersed thereinto, does not cause dissolution of Cu or Cu alloy. Thus, it is possible to avoid problems such as a problem that the etched amount of Cu varies dependently on timing of supplying the polishing composition in the polishing step, or the like. The operation for it can easily be carried out.

In the case wherein a Cu film or a Cu alloy film is polished with the polishing machine shown in FIG. 3, the Cu film or the Cu alloy film is polished only while the polishing pad 2 contacts it (slides thereon). When the polishing pad 2 is apart from the Cu film, the polishing immediately stops. Therefore, it is possible to obstruct further etching of the Cu film or the Cu alloy film after the polishing, that is, what is called overetching.

In the polishing composition according to the present invention, it is possible to heighten, in polishing, capability of selectively polishing Cu or Cu alloy, and an insulating film such as $SiO_2$ by addition of a non-ionic, amphoteric, cationic, or anionic surfactant.

The following will describe a method for manufacturing a semiconductor device according to the present invention.

This method for manufacturing a semiconductor device comprises the steps of:

forming at least one member for embedment selected from an opening corresponding to a shape of a via fill and a trench corresponding to a shape of a wiring layer in an insulating film on a semiconductor substrate;

forming a conductive material film comprising copper or copper alloy on the insulating film including the member; and polishing the conductive material film, for example, until a surface of the insulting film exposed, by using a polishing composition comprising a water-soluble first organic acid capable of reaction with copper to produce a copper complex compound which is substantially insoluble in water and has a mechanical strength lower than that of copper, at least one second organic acid selected from an organic acid having a single carboxyl group and a single hydroxyl group and oxalic acid, an abrasive grain, an oxidizing agent and water, so as to have the same level as the surface of the insulating film, thereby forming at least one conductive member selected from a wiring layer and a via fill in the member for embedment.

The insulating film which can be used is, for example, a silicon oxide film, a boron-added glass film (BPSG film), or a phosphorus-added glass film (PSG film). This insulating film may be covered with a polishing stopper film made of silicon nitride, carbon, alumina, boron nitride, diamond or the like.

The insulating film is preferably made of an insulating material having a dielectric constant of 3.5 or less. Examples of the insulating materials having this dielectric constant include SiOF, organic material spin-on glass, polyimide, fluorine-added polyimide, polytetrafluoroethylene, polyallyl ether fluoride, and fluorine-added parylene. By using the insulating film having such a dielectric constant, it is possible to raise the signal-transmission-speed of the conductive member such as the wiring layer comprising copper or copper alloy and embedded in this insulating film.

The Cu alloy which can be used is, for example, Cu—Si alloy, Cu—Al alloy, Cu—Si—Al alloy, or Cu—Ag alloy.

The conductive material film comprising Cu or Cu alloy may be formed by sputtering deposition, vacuum deposition, plating or the like.

Specifically, the conductive material film comprising copper or copper alloy is formed by sputtering or CVD, or by subjecting to electroless plating.

It is preferred that the first organic acid in the polishing composition, and its content therein are the same acid and the same range as in the aforementioned copper-based metal polishing composition.

It is preferred that the second organic acid in the polishing composition, and its content therein are the same acid and the same range as in the aforementioned copper-based metal polishing composition.

The abrasive grain in the polishing composition is made of at least one material selected from silica, zirconia, cerium oxide, and alumina. It is especially preferred that the abrasive grain is colloidal alumina alone, or mixture particles of colloidal alumina and silica particles, such as colloidal silica. The polishing composition containing such colloidal alumina as the abrasive grain makes it possible to suppress damage of the polished surface of copper or copper alloy.

The abrasive grain preferably has an average primary particle size of 0.02 to 0.1 $\mu m$ and has a spherical or substantially spherical shape. Polishing by the polishing composition containing such an abrasive grain makes it possible to suppress damage of the polished surface of Cu or Cu alloy.

The abrasive grain content is preferably from 1 to 20% by weight, and more preferably from 2 to 7% by weight, in the same manner as in the copper-based metal polishing composition.

It is preferred that the oxidizing agent in the polishing composition, and its content therein are the same agent and the same range as in the aforementioned copper-based metal polishing composition.

Additionally, a non-ionic, amphoteric, cationic, or anionic surfactant may be added to the polishing composition.

Polishing by the polishing composition is carried out by using the polishing machine shown in FIG. 3.

In the polishing treatment using the polishing machine shown in FIG. 3, the load for pressing the substrate held by substrate the holder onto the polishing pad is appropriately selected dependently on the composition of the polishing composition, but it is preferably from, for example, 50 to 1000 $g/cm^2$.

In manufacturing a semiconductor device according to the present invention, a conductive barrier layer may be formed before the conductive material film is formed on the insulating film which is deposited on the substrate and includes at least one member for embedment selected from the trench and the opening portion. Formation of such a conductive barrier layer on the insulating film including the member makes it possible to form the conductive material film such as a Cu film, and form at least one conductive member selected from a wiring layer and a via fill in at least one member for embedment selected from the trench and the opening and surrounded by the barrier layer by etch back treatment. As a result, it is possible to obstruct diffusion of Cu, which is a conductive material, into the insulting film by the barrier layer, and prevent contamination of the semiconductor substrate caused by Cu.

The barrier layer is made of one or more layers comprising at least one selected from, for example, TiN, Ti, Nb, W, WN, TaN, TaSiN, Ta, Co, Zr, ZrN and CuTa alloy. Such a conductive barrier layer preferably has a thickness of 15 to 50 nm.

In the method for manufacturing a semiconductor device according to the present invention, described above, at least one member for embedment selected from an opening corresponding to a shape of a via fill and a trench corresponding to a shape of a wiring layer is first formed on an insulating film on a semiconductor substrate, and then a conductive material film comprising Cu or Cu alloy is formed on the insulating film including the member. Subsequently, the conductive material film is polished, for example, until the surface of the insulating film is exposed by using a water-soluble first organic acid capable of reaction with copper to produce a copper complex compound which is substantially insoluble in water and has a mechanical strength lower than that of copper, at least one second organic acid selected from an organic acid having a single carboxyl group and a single hydroxyl group and oxalic acid, an abrasive grain, an oxidizing agent, and water, and the polishing machine shown in FIG. 3. As described above, the Cu film or the Cu alloy film cannot be dissolved at all into the polishing composition, in immersing the Cu film or the Cu alloy film therein, and in polishing the film, the polishing composition makes it possible to polish the Cu film or the Cu alloy film at a high rate.

As a result, in the polishing step the conductive material film is successively polished from its surface, namely, is subjected to what is called etch back treatment. Therefore, at least one conductive member selected from a wiring layer and a via fill comprising Cu or Cu alloy is formed inside at least one member for embedment selected from the trench and the opening of the insulating film, so that the level of the conductive member is the same level as the surface of, for example, the insulating film. The conductive member as wiring layer after the etch back step contacts the polishing composition, but Cu or Cu alloy cannot be dissolved therein, as described above. Thus, it is possible to avoid dissolution (etching) of the conductive member.

Accordingly, it is possible to manufacture a semiconductor device having a conductive member such as an embedded wiring layer with high precision, and a structure whose surface is flat.

Moreover, the surface of the conductive member such as the embedded wiring layer formed on the insulating film contacts the polishing composition to produce the aforementioned copper complex compound thereon but its thickness is very thin, that is, 20 nm. Consequently, excessive thinning of the conductive member such as the embedded wiring layer film can be avoided when the copper complex layer is removed to expose the surface of pure Cu.

Besides, use of far softer colloidal alumina than γ-alumina as the abrasive grain makes it possible, for example, when the copper film or the copper alloy film formed on the insulating film is polished, to suppress generation of injuries on the polished surface of this metal film. Consequently, it is possible to form highly reliable conductive member such as embedded wiring layer having in its insulating film no injuries causing snapping of the wiring.

Furthermore, if the polishing composition further contains a non-ionic, amphoteric, cationic, or anionic surfactant, it is possible to raise the capability of selectively polishing the conductive material film made of Cu or Cu alloy, and the insulating film such as $SiO_2$ in the etch back step. This makes it possible to suppress thinning of the insulating film as an undercoat, and manufacture a semiconductor device with a high breakdown voltage. Additionally use of the polishing composition containing such a surfactant makes it possible to easily remove contaminants, such as fine conductive materials and organic materials, remaining on the insulating film in washing after the etch back step. As a result, a semiconductor device can be manufactured that has a clean surface from which the organic materials and remaining conductive materials on the surface of the insulating film are removed off.

The following will describe a method for manufacturing a semiconductor device having wiring of a dual damascene structure, according to the present invention.

This method for manufacturing a semiconductor device, comprises the steps of:

forming a trench corresponding to a shape of a wiring layer in an insulating film on a semiconductor substrate, and forming an opening reached to a surface of the semiconductor substrate in the insulating film portion which is positioned at a part of the bottom of the trench;

forming a conductive material film comprising copper or copper alloy on the insulating film including the trench and the opening; and polishing the conductive material film by using a polishing composition comprising a water-soluble first organic acid capable of reaction with copper to produce a copper complex compound which is substantially insoluble in water and has a mechanical strength lower than that of copper, at least one second organic acid selected from an organic acid having a single carboxyl group and a single hydroxyl group and oxalic acid, an abrasive grain, an oxidizing agent, and water, thereby forming wiring having a dual damascene structure in the opening and trench.

It is allowable to form, on the surface of the semiconductor substrate in which the opening is positioned, a diffusion layer of the same conduction type as the conduction type of the substrate or of the reverse conduction type to the conduction type of the substrate. The former diffusion layer can be used for substrate-bias, and the latter diffusion layer can be used as a wiring layer.

The insulating film which can be used is, for example, a silicon oxide film, a boron-added glass film (BPSG film), or a phosphorus-added glass film (PSG film). This insulating film may be covered with a polishing stopper film made of silicon nitride, carbon, alumina, boron nitride, diamond or the like.

The insulating film is preferably made of the above-mentioned insulating material having a dielectric constant of 3.5 or less. By using the insulating film having such a dielectric constant, it is possible to raise the signal-transmission-speed of the wiring layer having a dual damascene structure and comprising copper or copper alloy embedded in this insulating film.

In order to make the trench or the opening in the insulating film, the following may be adopted:

(1) a trench corresponding to the shape of the wiring layer is made in the insulating film by a selective etching technique, and then the bottom of the trench is partially and selectively etched to make an opening which reaches to the surface of the semiconductor substrate, or (2) a hole is formed in the insulating film by a selective etching technique in the manner that the length from the bottom of the hole to the surface of the substrate corresponds to the depth of a trench described later, and then the insulating film having the hole is selectively etched to make a trench corresponding to the shape of the wiring layer and simultaneously remove the insulating film portion of the hole bottom.

The Cu alloys which can be used may be, for example, Cu—Si alloy, Cu—Al alloy, Cu—Si—Al alloy, and Cu—Ag alloy.

The conductive material film comprising Cu or the Cu alloy may be formed by sputtering deposition, vacuum deposition, electroless plating or the like. Specifically, the conductive material film comprising copper or copper alloy is formed by sputtering or CVD, or by subjecting to electroless plating.

The first organic acid in the polishing composition and its content therein are preferably the same as the first acid in the above-mentioned copper-based metal polishing composition and its content therein.

The second organic acid in the polishing composition and its content therein are preferably the same as the second acid in the above-mentioned copper-based metal polishing composition and its content therein.

The abrasive grain in the polishing composition is made of at least one selected from silica, zirconia, cerium oxide, and alumina. Especially preferred are colloidal alumina alone or blend grains of colloidal alumina and a silica grain such as colloidal silica. The polishing composition containing such colloidal alumina as an abrasive grain makes it possible to suppress damage of the polished surface of copper or copper alloy.

The abrasive grain has an average primary particle size of 0.02 to 0.1 µm and has a spherical or substantially spherical shape. Polishing by the polishing composition containing such an abrasive grain makes it possible to suppress damage of the polished surface of copper or copper alloy.

The content of the abrasive grain is preferably from 1 to 20% by weight, and more preferably from 2 to 7% by weight in the same way as in the above-mentioned copper-based metal polishing composition.

The oxidizing agent in the polishing composition and its content therein are preferably the same as the oxidizing agent in the above-mentioned copper-based metal polishing composition and its content therein.

Further, a non-ionic, amphoteric, cationic, or anionic surfactant may be added into the polishing composition.

The polishing by the polishing composition is performed, using, for example, the polishing machine illustrated in FIG. 3.

In the polishing using the polishing machine shown in FIG. 3, the load for pressing the substrate held by the substrate holder against the polishing pad may be appropriately selected but is preferably from, e.g., 50 to 1000 g/cm$^2$.

In the manufacture of the semiconductor device according to the present invention, a conductive barrier layer may be formed before the conductive material film is formed on the insulating film, on the substrate, including the trench or the opening. By such a conductive barrier layer on the insulating film including the trench or the opening, a wiring having a dual damascene structure can be formed in the trench or the opening surrounded by the conductive barrier layer by the formation of the conductive material film such as a Cu film and etch back. As a result, the diffusion of Cu, which is a conductive material, into the insulating film is blocked by the conductive barrier layer, so that the semiconductor substrate is prevented from pollution by Cu.

The conductive barrier layer is composed of one or more layers comprising at least one selected from, for example, TiN, Ti, Nb, W, WN, TaN, TaSiN, Ta, Co, Zr, ZrN and CuTa alloy. Such a conductive barrier layer preferably has a thickness of 15 to 50 nm.

The above-mentioned method for manufacturing a semiconductor device, according to the present invention, comprises forming a trench corresponding to a shape of a wiring layer in an insulating film on a semiconductor substrate, and an opening which reaches the surface of the semiconductor substrate in the insulating film portion positioned at one part of the bottom of the trench; forming a conductive material film comprising Cu or Cu alloy on the insulating film including the trench and the opening; and then using a polishing composition comprising a water-soluble first organic acid capable of reaction with copper to produce a copper complex compound which is substantially insoluble in water and has mechanical strength lower than copper, at least one second organic acid selected from an organic acid having a single carboxyl group and a hydroxyl group and oxalic acid, an abrasive grain, an oxidizing agent, and water, and a polishing machine shown in, for example, FIG. 3 to polish the conductive material film until the surface of the insulating film is exposed. When the Cu film or the Cu alloy film is immersed in the polishing composition, the Cu film or the Cu alloy film is not dissolved at all. When the Cu film or the Cu alloy film is polished with the polishing composition, the conductive material film can be polished at a high speed.

As a result, in the polishing step, the conductive material film is in sequence polished from its surface, that is, is subjected to etch back. For this reason, the wiring having a dual damascene structure can be formed inside the trench and the opening in the insulating film and at the same level as the surface of the insulating film. The wiring after the etch back step is brought into contact with the polishing composition, but the Cu or Cu alloy is not dissolved in the polishing composition so as to avoid the dissolution (etching) of the wiring.

Therefore, it is possible to manufacture a semiconductor device having the wiring of the dual damascene structure with a high precision.

The surface of the wiring formed in the insulating film is brought into contact with the polishing composition to produce a copper complex. Its thickness is however very thin, i.e., 20 nm. Therefore, when the copper complex layer is removed to expose the surface of pure Cu, excessive thinning of the wiring can be avoided.

For example, when a metal film of copper or copper alloy deposited on the substrate is polished, the generation of injuries of the polished surface of the metal can be avoided by using, as an abrasive grain, colloidal alumina that is far softer than γ-alumina. As a result, it is possible to form reliable wiring of a dual damascene structure having no injuries which may result in the snapping of the wiring.

If the polishing composition further containing a non-ionic, amphoteric, cationic, or anionic surfactant is used, it is possible to suppress thinning of the underlying insulating film, manufacture a semiconductor device having a high breakdown voltage, and remove easily pollutants such as fine conductive materials and organic substances remaining on the insulating film in washing after the etch back step.

The following will describe a method for manufacturing a semiconductor device having a multilayer wiring structure, according to the present invention.

This method for manufacturing a semiconductor device, comprises the steps of:

forming at least a first opening corresponding to a shape of a first via fill in a first insulating film on a semiconductor substrate, forming a first conductive material film comprising copper or copper alloy on the insulating film including the opening;

polishing the conductive material film by using a polishing composition comprising a water-soluble first organic acid capable of reaction with copper to produce a copper complex compound which is substantially insoluble in water and has a mechanical strength lower than that of copper, at least one second organic acid selected from an organic acid having a single carboxyl group and a single hydroxyl group and oxalic acid, an abrasive grain, an oxidizing agent, and water, thereby forming the first via fill in the first opening;

forming a second insulating film on the first insulating film including the first via fill;

forming a second opening corresponding to a shape of a second via fill reached to at least said first via fill in the second insulating film;

forming a second conductive material film comprising copper or copper alloy on the second insulating film including the second opening; and polishing the second conductive material film by using a second polishing composition comprising a water-soluble first organic acid capable of reaction with copper to produce a copper complex compound which is substantially insoluble in water and has a mechanical strength lower than that of copper, at least one second organic acid selected from an organic acid having a single carboxyl group and a single hydroxyl group and oxalic acid, an abrasive grain, an oxidizing agent, and water, thereby forming the second via fill in the second opening.

It is allowable to form, in the surface of the semiconductor substrate in which the first via fill is positioned, a diffusion layer of the same conduction type as the conduction type of the substrate or of the reverse conduction type to the conduction type of the substrate. The former diffusion layer can be used for substrate-bias, and the latter diffusion layer can be used as a wiring layer.

As the first and second insulating films, there may be used, for example, a silicon oxide film, a boron-added glass film (BPSG film), phosphorus-added glass film (PSG film), or the like. The surface of the second insulting film is coated with an insulating polishing stopper film comprising silicon nitride, carbon, alumina, boron nitride, diamond or the like.

At least one of the first and second insulating films is preferably made of the above-mentioned insulating material having a dielectric constant of 3.5 or less.

The Cu alloy which can be used is, for example, Cu—Si alloy, Cu—Al alloy, Cu—Si—Al alloy, or Cu—Ag alloy.

The first and second conductive material films comprising Cu or Cu alloy may be formed by sputtering deposition, vacuum deposition, electroless plating or the like. Specifically, the conductive material film comprising copper or copper ally is formed by sputtering or CVD, or by subjecting to electroless plating.

The first organic acid in the first and second polishing compositions and its content therein are preferably the same as the first acid in the above-mentioned copper-based metal polishing composition and its content therein.

The second organic acid in the first and second polishing compositions and its content therein are preferably the same as the second acid in the above-mentioned copper-based metal polishing composition and its content therein.

The abrasive grain in the first and second polishing compositions is made of at least one selected from silica, zirconia, cerium oxide, and alumina. Especially preferred are colloidal alumina alone or blend grains of colloidal alumina and a silica grain such as colloidal silica. The polishing composition containing such colloidal alumina as an abrasive grain makes it possible to suppress damage of the polished surface of copper or copper alloy.

The abrasive grain has an average primary particle size of 0.02 to 0.1 $\mu$m and has a spherical or substantially spherical shape. Polishing by the polishing composition containing such an abrasive grain makes it possible to suppress damage of the polished surface of copper or copper alloy.

The content of the abrasive grain is preferably from 1 to 20% by weight, and more preferably from 2 to 7% by weight in the same way as in the above-mentioned copper-based metal polishing composition.

The oxidizing agent in the first and second polishing compositions and its content therein are preferably the same as the oxidizing agent in the above-mentioned copper-based metal polishing composition and its content therein.

Further, a non-ionic, amphoteric, cationic, or anionic surfactant may be added into the first and second polishing compositions.

The polishing by the first and second polishing compositions is performed, using the polishing machine illustrated in, for example, FIG. 3.

In the polishing using the polishing machine shown in FIG. 3, the load for pressing the substrate held by the substrate holder against the polishing pad may be appropriately selected but is preferably from, e.g., 50 to 1000 g/cm$^2$.

The first and second polishing compositions are the same or different in their components and the ratio of the components.

The step described in the following may be added to the method for manufacturing a semiconductor device according to the present invention.

(1) After a first trench corresponding to a shape of a first wiring layer is further formed in the first insulating film and the first conductive material film comprising copper or copper alloy is formed on the first insulating film including the first trench and the first opening, the first polishing composition is used to polish the conductive material film, thereby making the first via fill in the first opening and the first wiring layer in the first trench.

(2) After a second trench corresponding to a shape of a second wiring layer is further formed in the second insulating film and the second conductive material film comprising copper or copper alloy is formed on the second insulating film including the second trench and the second opening, the second polishing composition is used to polish the second conductive material film, thereby making the second via fill in the second opening and the second wiring layer in the second trench.

(3) After a first trench corresponding to a shape of a first wiring layer is further formed in the first insulating film and the first conductive material film comprising copper or copper alloy is formed on the first insulating film including the first trench and said first opening, the first polishing composition is used to polish the first conductive material film, thereby making the first via fill in the first opening and the first wiring layer in the first trench, and after a second trench corresponding to a shape of a second wiring layer is further formed in the second insulating film and the second conductive material film comprising copper or copper alloy is formed on the second insulating film including the second trench and the second opening, the second polishing composition is used to polish the second conductive material film, thereby making the second via fill in the second opening and the second wiring layer in the second trench.

(4) After a first trench corresponding to a shape of a first wiring layer is further formed in the first insulating film and the first conductive material film comprising copper or copper alloy is formed on the first insulating film including the first trench and the first opening, the first polishing composition is used to polish the conductive material film, thereby making the first via fill in the first opening and the first wiring layer in the first trench, and after a third opening corresponding to a shape of a third via fill reached to the first wiring layer is further formed in the second insulating film and the second conductive material film comprising copper or copper alloy is formed on the second insulating film including the third opening and the second opening, the second polishing composition is used to polish the second conductive material film, thereby making the second via fill in the second opening and the third via fill in the third opening.

In the manufacture of a semiconductor device according to the present invention, a conductive barrier layer may be formed before the first conductive material film is formed on the first insulating film including the first opening (and the first trench), or before the second conductive material film is formed on the second insulating film including the second opening (and the second trench). By forming such a conductive barrier layer on the insulating film including the opening (and the trench), a via fill can be formed in the opening surrounded by the conductive barrier layer by the formation of the conductive material film such as a Cu film and etch back. As a result, the diffusion of Cu, which is a conductive material, into the insulating film is blocked by the conductive barrier layer, so that the semiconductor substrate is prevented from pollution by Cu.

The conductive barrier layer is composed of one or more layers comprising at least one selected from, for example, TiN, Ti, Nb, W, WN, TaN, Ta, Co, Zr, ZrN and CuTa alloy. Such a conductive barrier layer preferably has a thickness of 15 to 50 nm.

In the case of the above-mentioned methods (1), (3) and (4) for forming the first wiring layer on the first insulating film, a barrier layer comprising at least one insulating material selected from silicon nitride and nitrogen-added silicon oxide may be formed on the first insulating film including the first wiring layer after the formation of the first wiring layer and before the formation of the second insulating film. The thickness of this barrier layer is preferably from 50 to 200 $\mu$m. Since such a barrier layer can cover the exposed surface of the first wiring layer comprising Cu or Cu alloy, it is possible to prevent the phenomenon that copper or copper alloy of this first wiring layer returns through the second insulating film to the first insulating film and then diffuses into the semiconductor substrate to pollute the substrate. The barrier layer comprising the insulating material prevents copper or copper alloy from diffusing from the second via fill (and the second wiring layer) made in the second insulating film to the first insulating film below it. As a result, it is possible to omit the formation of the above-mentioned conductive barrier layer on the second insulating film for preventing copper or copper alloy from diffusing to the second opening (and the second trenches).

In the case of the above-mentioned methods (1), (3) and (4) for forming the first wiring layer on the first insulating film, it is allowable to form one or more conductive barrier layers comprising at least one selected from, for example, TiN, Ti, Nb, W, WN, TaN, TaSiN, Ta, Co, Zr, ZrN and CuTa alloy.

According to the method for manufacturing a semiconductor device of the present invention, it is possible to form, in the first insulating film, at least the high-precision first via fill reached to the surface of the semiconductor substrate and comprising copper or copper alloy, and form, in the second insulating film, at least the high-precision via fill which is connected to the first via fill and comprises copper or copper alloy. As a result, it is possible to obtain a semiconductor device having a multilayer wiring structure comprising copper or copper alloy.

The following will describe another polishing composition according to the present invention.

This polishing composition comprises colloidal alumina and water.

As the colloidal alumina, the same as in the aforementioned copper-based metal polishing composition can be used.

The colloidal alumina preferably has an average primary particle size of 0.02 to 0.1 $\mu$m and has a spherical or substantially spherical shape. Polishing the surface of a metal by the polishing composition containing such colloidal alumina makes it possible to suppress damage of the polished surface even more.

The colloidal alumina content is preferably from 0.1 to 50% by weight in the polishing composition. If the colloidal alumina content is less than 0.1% by weight, it becomes difficult to attain its effect sufficiently. On the other hand, if the colloidal alumina is more than 50% by weight, handling thereof becomes difficult because of a rise in viscosity of the polishing composition. The colloidal alumina content is more preferably from 1 to 20% by weight, and most preferably from 1 to 5% by weight.

The polishing composition according to the present invention may further contain from 1 to 10% by weight of colloidal silica.

In order to polish, for example, a metal film deposited on a substrate by using the polishing composition according to the present invention, the polishing machine shown in FIG. 3 may be used.

The polishing composition according to the present invention contains water and colloidal alumina, which is far softer than γ-alumina. For this reason, the composition is used to polish, for example, a metal film formed on a substrate, so that the surface of the metal can be polished at a rate of a practical level and generation of injuries on the metal surface can be suppressed.

When the aforementioned polishing composition is applied to, in particular, the technique that an insulating film having trenches on a semiconductor substrate is covered with a metal film and then the metal film is subjected to etch back treatment using the polishing machine shown in FIG. 3, the metal film can be formed at the same level as the surface of the insulating film and breakout of injuries on the metal film surface can be suppressed. As a result, it is possible to form highly reliable embedded wiring having on its insulating film no injuries resulting in the snapping of the wiring.

Examples of metals to be polished by the polishing composition according to the present invention include Cu, Cu alloy, Al, Al alloy, W, Pt, and Re.

In the case of polishing a metal film comprising, in particular, Cu, Cu alloy, Al, Al alloy or W, the following polishing compositions which contains various additives, as well as colloidal alumina, may be used.

1) Copper-based Metal Polishing Composition

This copper-based metal polishing composition comprises a water-soluble organic acid capable of reaction with copper to produce a copper complex compound which is substantially insoluble in water and has a mechanical strength lower than that of copper an oxidizing agent, colloidal alumina, and water. The surface of Cu or Cu alloy is not dissolved into such a polishing composition in immersing Cu or Cu alloy thereinto. In polishing, Cu or Cu alloy can be polished at a practical rate.

The organic acid has, when the polishing composition is brought into contact with copper or copper alloy, a function of reacting with a copper hydrate generated by the oxidizing agent to produce a copper complex compound which is substantially insoluble in water and has a mechanical strength lower than that of Cu. Examples of such organic acid include 2-quinoline carboxylic acid (quinaldinic acid), 2-pyridine carboxylic acid, 2,6-pyridine carboxylic acid and quinone.

As the aforementioned oxidizing agent, for example, hydrogen peroxide ($H_2O_2$) or sodium hypochlorite (NaClO) can be used.

In the polishing composition, it is preferred that the organic acid is contained in an amount of 0.1% or more by weight, and the oxidizing agent is contained 10 times or more by weight as large as the organic acid. The reasons why the organic acid content in the polishing composition and the contained ratio of the oxidizing agent to the organic acid are specified are as follows.

If the organic acid content is less than 0.1% by weight, it becomes difficult to sufficiently produce the copper complex compound that is a mechanical strength lower than that of copper on the surface of Cu or Cu alloy. As a result, it becomes difficult to heighten the polishing rate of Cu or Cu alloy sufficiently in polishing. The organic acid content is more preferably from 0.3 to 1.2% by weight.

If the weight of the oxidizing agent is below 10 times as large as that of the organic acid, it is feared that when the obtained polishing composition contacts Cu or Cu alloy, it becomes difficult to form a complex layer which can easily be polished by polishing treatment. The contained ratio of the oxidizing agent to the organic acid is preferably 30 times or more, and more preferably 50 times or more by weight as large as the organic acid.

The colloidal alumina content is preferably from 0.1 to 50% by weight for the same reason as about the aforementioned polishing composition. The colloidal alumina content is more preferably from 1 to 20% by weight, and most preferably from 1 to 5% by weight.

The copper-based metal polishing composition may further contain colloidal silica in an amount of 1 to 10% by weight.

The Cu alloys to be polished may be, for example, Cu—Si alloy, Cu—Al alloy, Cu—Si—Al alloy, and Cu—Ag alloy.

The copper-based metal polishing composition according to the present invention, described above, comprises the organic acid (for example, 2-quinoline carboxylic acid), the oxidizing agent, colloidal alumina and water. Therefore, in immersing Cu or Cu alloy therein, Cu or Cu alloy is not dissolved at all therein and, in polishing, Cu or Cu alloy can be polished at a practical rate with outbreak of injuries on its surface being suppressed. The practical rate herein means a rate 5 to 9 times or more as large as the rate in case of using the polishing composition containing only colloidal silica.

Namely, the organic acid (for example, 2-quinoline carboxylic acid) which is a component of the polishing composition has a nature of reacting with the Cu hydrate (Cu ion) as shown in the aforementioned reaction formula to produce a complex compound which is substantially insoluble in water.

Since the complex compound produced on the surface of Cu or Cu alloy has a mechanical strength lower than that of Cu, the complex compound can easily be polished by polishing treatment with the polishing composition containing colloidal alumina.

For example, the Cu film 12 having unevenness is formed on the substrate 11 as shown in FIG. 4A, and then this substrate 11 is immersed for 3 minutes into the polishing composition (containing 2-quinoline carboxylic acid, colloidal alumina, colloidal silica and hydrogen peroxide in amounts of 0.3, 1.3, 4.0 and 16.7% by weight, respectively), so that the complex layer 13 is produced on the surface of the Cu film 12 as shown in FIG. 4B. The surface of the Cu film after the immersion into the polishing composition was analyzed by XPS (X-ray photoelectron spectroscopy). As a result, a great deal of carbon was detected on the surface of the Cu film, and only a small quantity of Cu was detected. The thickness of the complex layer was examined by AES (Auger electron spectroscopy). As a result, the thickness of the complex layer was about 20 nm.

Thereafter, the polishing machine shown in FIG. 3 and the polishing composition are used to polish the Cu film 12 wherein the complex layer 13 is formed on its surface shown in FIG. 4B by means of the polishing pad on which the polishing composition exists. As a result, as shown in FIG. 4C, the complex layer 13 corresponding to convex portions of the Cu layer 12 is easily and mechanically polished so that pure Cu is exposed. The surface of Cu immediately after the polishing was analyzed by XPS (X-ray photoelectron spectroscope) so that only Cu was detected and oxidation hardly occurred. In other words, processing of the surface of the Cu film advances by producing the complex layer on the surface of the Cu film while removing the complex layer mechanically by means of the polishing pad in the polishing step.

Therefore, in immersing the film comprising Cu or Cu alloy into the copper-based metal polishing composition, the composition does not cause Cu or Cu alloy to dissolve therein while in polishing the film the composition causes the Cu film to be polished at a practical rate (5 to 9 times as large as in case of using the polishing composition containing only colloidal alumina). For this reason, it is possible to avoid problems, for example, that in the polishing step the etched amount of the copper-based metal varies, dependently on supplying timing of the polishing composition or the like. Thus, operation for it can easily be performed. Moreover, it is possible to remarkably suppress generation of injuries on the polished surface of the metal film of Cu or Cu alloy.

In the case wherein the Cu film on the substrate is polished by means of the polishing machine, the Cu film is polished only when the polishing pad contacts (slides) the Cu film at a given load. When the polishing pad is apart from the Cu film, the polishing stops immediately. Thus, it is possible to obstruct further etching of the Cu film after the polishing, that is, what is called overetching.

Additionally, as shown FIG. 4C, the Cu film 12 having unevenness is not etched from its side in the polishing step and can be etched successively from its convex surface contacting the polishing pad. This is very suitable for etch back technique, which will be described later. Moreover, the Cu film surface to which the polishing treatment is applied contacts the polishing composition so that the complex film is formed. However, its thickness is very thin, that is, 20 nm, thereby making it possible to avoid excessive thinning of the Cu film when the complex layer is removed to expose the surface of pure Cu.

The following will describe a method for manufacturing a semiconductor device, in which the aforementioned copper-based metal polishing composition is applied to its etch back step.

This method for manufacturing a semiconductor device, comprising the steps of:

forming at least one member for embedment selected from an opening corresponding to a shape of a via fill and a trench corresponding to a shape of a wiring layer in an insulating film on a semiconductor substrate;

forming a conductive material film comprising copper or copper alloy on the insulating film including the member for embedment; and polishing the conductive material film by using a polishing composition comprising a water-soluble organic acid capable of reaction with copper to produce a copper complex compound which is substantially insoluble in water and has a mechanical strength lower than that of copper, an oxidizing agent, colloidal alumina and water, so as to have the same level as the surface of the insulating film, thereby forming at least one conductive member selected from an embedded wiring layer and a via fill in the member for embedment.

The insulating film which can be used are, for example, a silicon oxide film, a boron-added glass film (BPSG), or phosphorus-added glass film. It is allowable to cover the insulating film with a polishing stopper film comprising silicon nitride, carbon, alumina, boron nitride, diamond or the like.

The Cu alloy which can be used is, for example, Cu—Si alloy, Cu—Al alloy, Cu—Si—Al alloy, Cu—Ag alloy, or the like.

The conductive material film comprising Cu or Cu alloy is formed by sputtering vapor deposition, vacuum vapor deposition, plating or the like.

The polishing by the polishing composition is performed by using, for example, the polishing machine shown in FIG. 3.

In the polishing using the polishing machine shown in FIG. 3, the load for pressing the substrate held by the substrate holder against the polishing pad may be appropriately selected in accordance with the components or the like in the polishing composition, but is preferably from 50 to 1000 g/cm$^2$.

In manufacturing a semiconductor device according to the present invention, a conductive barrier layer may be formed before forming the conductive material film on the insulating film which is formed on the semiconductor substrate and includes at least one member for embedment selected from the trench and the opening. Formation of such a conductive barrier layer on the insulating film including the member makes it possible to form the conductive material film such as a Cu film, and form an embedded wiring layer surrounding by the conductive barrier layer inside the trench or the like member by etch back treatment. As a result, it becomes possible to block diffusion of Cu, which is a conductive material, into the insulating film by the barrier layer, and prevent contamination of the semiconductor substrate caused by Cu.

The conductive barrier layer is made of, for example, one or more layers comprising at least one selected from TiN, Ti, Nb, W, WN, TaN, TaSiN, Ta, Co, Zr, ZrN and CuTa alloy. The thickness of the conductive barrier layer is preferably from 15 to 50 nm.

In the method for manufacturing a semiconductor device according to the present invention, described above, at least one member for embedment selected from an opening corresponding to a shape of a via fill and a trench corresponding to a shape of a wiring layer is first formed in an insulating film on a semiconductor substrate, and then a conductive material film comprising Cu or Cu alloy is formed on the insulating film including the member. Subsequently, the conductive material film is polished until the surface of the insulating film is exposed by using a water-soluble organic acid capable of reaction with copper to produce a copper complex compound which is substantially insoluble in water and has a mechanical strength lower than that of copper, an oxidizing agent, colloidal alumina and water, and the polishing machine shown in, for example FIG. 3. As described above, the Cu film or the Cu alloy film cannot be dissolved at all into the polishing composition in immersing the Cu film or the Cu alloy film therein, and in polishing the film the polishing composition makes it possible to polish the Cu film or the Cu alloy film at a high rate.

As a result, in the polishing step the conductive material film is successively polished from its surface, namely, is subjected to what is called etch back treatment. Therefore, a conductive member such as an embedded wiring layer comprising Cu or Cu alloy is formed inside the member for embedment in the insulating film, so that the level of the conductive member is the same level as the surface of the insulating film. The conductive member after the etch back step contacts the polishing composition, but Cu or Cu alloy cannot be dissolved therein. Thus, it is possible to avoid dissolution (etching) of the conductive member.

Besides, use of far softer colloidal alumina than γ-alumina as the abrasive grain makes it possible, for example, when the metal film of copper or the copper alloy formed on the substrate is polished, to suppress generation of injuries on the polished surface of this metal.

Consequently, it is possible to form a semiconductor device having a conductive member such as an embedded highly-reliable wiring layer having in its insulating film no injuries causing snapping of the wiring, and having a structure whose surface is flat.

2) Aluminum-based Metal Polishing Composition

The aluminum-based metal polishing composition has a composition comprising at least one polishing promoter selected from trimethyl ammonium hydroxide, trimethyl hydroxide, a mixed acid of phosphoric acid, sulfuric acid and acetic acid, and ferric chloride; an oxidizing agent; colloidal alumina; and water.

As the aforementioned oxidizing agent, for example, hydrogen peroxide ($H_2O_2$) or sodium hypochlorite (NaClO) can be used.

In the polishing composition, it is preferred that the polishing promoter is contained in an amount of 5% or more by weight, and the oxidizing agent is contained 10 times or more by weight as large as the polishing promoter.

The colloidal alumina content is preferably from 0.1 to 50% by weight for the same reason as about the aforementioned polishing composition. The colloidal alumina content is more preferably from 1 to 20% by weight, and most preferably from 1 to 5% by weight.

The copper-based metal polishing composition may further contain colloidal silica in an amount of 1 to 10% by weight.

The Al alloys to be polished may be, for example, Al—Si alloy, or Al—Cu—Si alloy.

Since the aluminum-based metal polishing composition comprises at least one polishing promoter selected from trimethyl ammonium hydroxide, trimethyl hydroxide, a mixed acid of phosphoric acid, sulfuric acid and acetic acid, and ferric chloride, the oxidizing agent, colloidal alumina, and water, the polishing promoter and the oxidizing agent chemically act on the surface of Al or Al alloy in polishing so that the surface is dissolved. In addition, the colloidal alumina exhibits mechanical polishing effect. Thus, the surface of Al or the Al alloy can be polished at a practical rate. The practical rate herein means a rate 10 to 20 times as large as in the case of using the polishing composition containing only colloidal alumina. Additionally, it is possible to suppress generation of injuries on the surface of Al or the Al alloy.

Therefore, the aluminum-based metal polishing composition makes it possible to polish the metal film comprising Al or the Al alloy at a practical rate (a rate about 10 to 20 times as large as that in the case of using the polishing composition containing colloidal alumina as an abrasive grain) with generation of injuries on its surface being suppressed; and the composition can be effectively used for forming a conductive member such as an embedded wiring layer comprising Al or the Al alloy in a semiconductor device.

3) Tungsten Polishing Composition

This tungsten polishing composition comprises at least one polishing promoter selected from ferric chloride and ferric nitrate, an oxidizing agent, colloidal alumina and water.

As the oxidizing agent, for example, potassium ferrocyanide, or hydrogen peroxide ($H_2O_2$) may be used.

It is preferred that the polishing composition contains 0.1% or more by weight of the polishing promoter, and the oxidizing agent is 0.5 times or more by weight as large as the polishing promoter.

The colloidal alumina content is preferably from 0.04 to 20% by weight for the same reason as about the aforementioned polishing composition. The colloidal alumina content is more preferably from 0.04 to 5% by weight.

The polishing composition may contain from 0.1 to 15% by weight of colloidal silica.

Since the tungsten polishing composition comprises at least one polishing promoter selected from ferric chloride and ferric nitrate, the oxidizing agent, colloidal alumina and water, the polishing promoter and the oxidizing agent chemically act on the surface of tungsten in polishing so that the surface is dissolved. In addition, the colloidal alumina exhibits mechanical polishing effect. Thus, the surface of tungsten can be polished at a practical rate. The practical rate herein means a rate about 10 to 20 times as large as in the case of using the aforementioned polishing composition containing only colloidal alumina. Additionally, it is possible to suppress generation of injuries on the surface of W.

Therefore, the tungsten polishing composition makes it possible to polish the metal film comprising W at a practical rate (a rate 10 to 20 times as large as the rate in case of using the polishing composition containing colloidal alumina as an abrasive grain) with outbreak of injuries on its surface being suppressed, and thus can be effectively used for forming a conductive member such as an embedded wiring layer comprising W in a semiconductor device.

Preferred examples will be described in detail hereinafter.

EXAMPLE 1

A Cu film was first deposited on a substrate by sputtering method. Subsequently, the substrate was held by the substrate holder 5 in the polishing machine shown in FIG. 3 so that the deposited Cu film opposed the polishing pad 2. The substrate was then pressed against the polishing pad 2 (trade name: IC1000/SUBA400, manufactured by Roder Nitta Co., Ltd.) by the supporting axial 4 of the holder 5 so as to apply a load of 500 g/cm$^2$, to the polishing pad 2. While the turn table 1 and the holder 5 were rotated at rates of 100 rpm and 103 rpm, respectively, in the same direction, a polishing composition was supplied at a rate of 20 ml/minute from the supplying tube 3 to the polishing pad 2. Thus, the Cu film deposited on the substrate 21 was polished. As this polishing composition, there was used a composition comprising pure water containing 1.2% by weight of colloidal alumina having an average primary particle size of 20 nm.

The rate of polishing the Cu film in the polishing step was measured. As a result, it was 5 nm/minute. The surface of the Cu film after the polishing was also observed with an optical microscope, so that generation of injuries having a depth of 20 nm or more was not observed at 500 magnifications in a dark field.

EXAMPLE 2

A Cu film was first deposited on a substrate by sputtering method. Subsequently, the substrate was held by the substrate holder 5 in the polishing machine shown in FIG. 3 so that the deposited Cu film opposed the polishing pad 2. The substrate was then pressed against the polishing pad 2 (trade mark: IC1000/SUBA400, manufactured by Roder Nitta Co., Ltd.) by the supporting axial 4 of the holder 5 so as to apply a load of 300 g/cm$^2$ to the polishing pad 2. While the turn table 1 and the holder 5 were rotated at rates of 100 rpm and 103 rpm, respectively, in directions opposite to each other, a polishing composition was supplied at a rate of 20 ml/minute from the supplying tube 3 to the polishing pad 2. Thus, the Cu film deposited on the substrate 21 was polished. As this polishing composition, there was used a composition comprising pure water containing 0.6% by weight of 2-quinoline carboxylic acid, 13% by weight of hydrogen peroxide, 1.2% by weight of colloidal alumina having an average primary particle size of 2 nm, and 4.4% by weight of colloidal silica.

COMPARATIVE EXAMPLE 1

A Cu film was polished in the same manner as in Example 1 except that the polishing composition used was a composition comprising pure water containing 0.6% by weight of 2-quinoline carboxylic acid, 13% by weight of hydrogen peroxide, 1.2% by weight of γ-alumina having an average primary particle size of 30 nm, and 4.4% by weight of colloidal silica.

The rates of polishing the Cu film in Example 2 and Comparative Example 1 were measured. As a result, the rate of polishing the Cu film in Example 2 was 42 nm/minute, and that in Comparative Example 1 was 50 nm/minute.

Using a scratch evaluating apparatus (trade name: Surfscan 6420, manufacture by Tencall Co., Ltd.) having a microscopic function of counting only the number of scratches from scattering in a radiated laser beam, in each of 50 positions the number of scratches having a size of 0.2 μm or less was measured in 1 mm square of the Cu surface of the substrates after the polishing in Example 2 and Comparative Example 1. As a result, in Comparative Example 1 the total scratch number was 148 in the 50 positions, and in Example 2 that was 4 in the 50 positions.

Therefore, it can be understood that the rate of polishing the Cu film was somewhat poorer in the polishing composition of Example 2 using colloidal alumina as an abrasive grain than in the polishing composition of Comparative Example 1 using γ-alumina as an abrasive grain but in Example 2 generation of injuries resulting in snapping of the wiring was remarkably reduced as compared with Comparative Example 1.

EXAMPLE 3

An Al film was first deposited on a substrate by sputtering method. Subsequently, the substrate was held by the substrate holder 5 in the polishing machine shown in FIG. 3 so that the deposited Al film opposed the polishing pad 2. The substrate was then pressed against the polishing pad 2 (trade mark: IC1000/SUBA400, manufactured by Roder Nitta Co., Ltd.) by the supporting axial 4 of the holder 5 so as to apply a load of 300 g/cm$^2$, to the polishing pad 2. While the turn table 1 and the holder 5 were rotated at rates of 100 rpm and 103 rpm, respectively, in the same direction, a polishing composition was supplied at a rate of 20 ml/minute from the supplying tube 3 to the polishing pad 2. Thus, the Al film deposited on the substrate 21 was polished. As this polishing composition, there was used a composition comprising pure water containing 1.29% by weight of trimethylammonium hydroxide, 0.5% by weight of hydrogen peroxide, and 4% by weight of colloidal alumina having an average primary particle size of 20 nm.

The rate of polishing the Al film in the polishing step was measured. As a result, it was 70 nm/minute. The surface of the Al film after the polishing was also observed with an optical microscope, so that generation of injuries having a depth of 20 nm or more was not observed at 500 magnifications in a dark field.

EXAMPLE 4

A W film was first deposited on a substrate by sputtering method. Subsequently, the substrate was held by the substrate holder 5 in the polishing machine shown in FIG. 3 so that the deposited W film opposed the polishing pad 2. The substrate was then pressed against the polishing pad 2 (trade name: IC1000/SUBA400, manufactured by Roder Nitta Co., Ltd.) by the supporting axial 4 of the holder 5 so as to apply a load of 300 g/cm$^2$, to the polishing pad 2. While the turn table 1 and the holder 5 were rotated at rates of 100 rpm and 103 rpm, respectively, in the same direction, a polishing composition was supplied at a rate of 20 ml/minute from the supplying tube 3 to the polishing pad 2. Thus, the W film deposited on the substrate 21 was polished. As this polishing composition, there was used a composition comprising pure water containing 0.1% by weight of ferric chloride, 4% by weight of hydrogen peroxide, and 0.07% by weight of colloidal alumina having an average primary particle size of 20 nm.

The rate of polishing the W film in the polishing step was measured. As a result, it was 50 nm/minute. The surface of the W film after the polishing was also observed with an optical microscope, so that generation of injuries having a depth of 20 nm or more was not observed at 500 magnifications in a dark field.

EXAMPLE 5

Figure 5A:
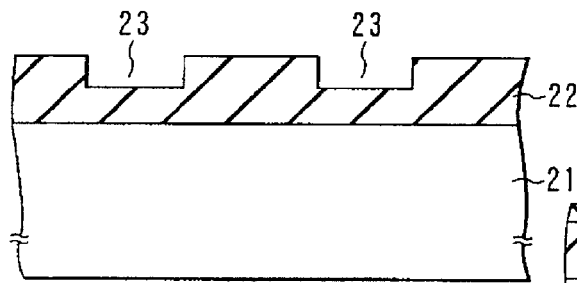
FIGS. 5A to 5C are cross sections illustrating a process for manufacturing a semiconductor device in Example 5 of the present invention.

As shown FIG. 5A, a SiO$_2$ film 22 as an interlayer dielectric, which had a thickness of, for example, 1000 nm, was first deposited by a CVD method on a silicon substrate 21 in which, in its surface, diffusion layers such as sources and drains not illustrated were formed. Thereafter, plural trenches 23 having a depth of 500 nm and a shape corresponding to wiring layers were formed in the SiO$_2$ film 22 by photo-etching technique. Subsequently, as shown in FIG. 5B, a conductive barrier layer 24 of TiN and of 15 nm thickness and a Cu film 25 of 600 nm thickness were deposited in this order on the SiO$_2$ film 22 including the trenches 23.

Figure 5B:
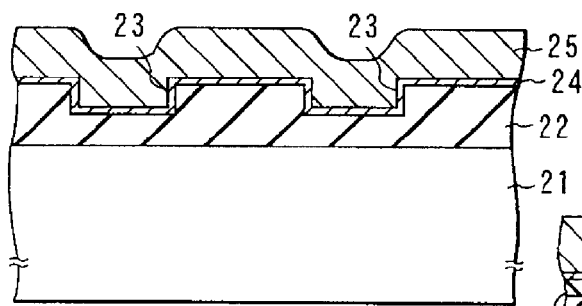
Figure 5C:
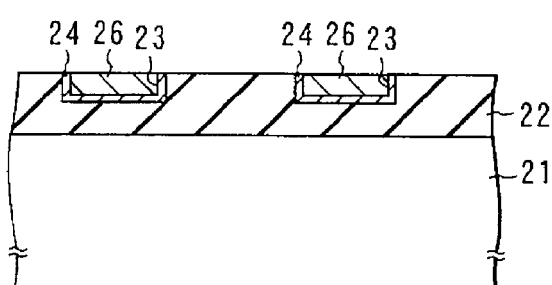

Next, the substrate 21 shown in FIG. 5B was held by the substrate holder 5 in the polishing machine shown in FIG. 3 so that its wiring forming surface opposed the polishing pad 2. The substrate was then pressed against the polishing pad (trade name: IC1000/SUBA400, manufactured by Roder Nitta Co., Ltd.) by the supporting axial 4 of the holder 5 so as to apply a load of 300 g/cm$^2$, to the polishing pad 2. While the turn table 1 and the holder 5 were rotated at rates of 100 rpm and 103 rpm, respectively, in the same direction, a polishing composition was supplied at a rate of 20 ml/minute from the supplying tube 3 to the polishing pad 2. Thus, the Cu film 25 and the barrier layer 24 deposited on the substrate 21 were polished until the surface of the SiO$_2$ film 22 was exposed. As this polishing composition, there was used a composition comprising pure water containing 0.6% by weight of 2-quinoline carboxylic acid, 13% by weight of hydrogen peroxide, 1.2% by weight of colloidal alumina having an average primary particle size of 20 nm, and 4.4% by weight of colloidal silica. In this polishing step, when the polishing composition contacted the Cu film, the composition caused no etching of the Cu film. In the polishing by means of the polishing pad, its polishing rate was about 80 nm/minute. Therefore, in the polishing step the convex Cu film 25 shown in FIG. 5B was preferentially polished from its surface mechanically contacting the polishing pad, and further the exposed barrier layer 24 was polished. That is, etch back treatment was performed. Consequently, the barrier layer 24 remained only inside the trenches 23 as shown in FIG. 5C, and additionally inside the trenches 23 covered with the barrier layer 24 was formed an embedded Cu wiring layer 26 having the same level as the surface of the SiO$_2$ film 22 and having no injuries of 20 nm or more depth at 500 magnifications in a dark field.

After the load against the polishing pad 2 by the holder 5 in the polishing machine was released and rotation of the turn table 1 and the holder 5 was stopped, etching did not advance even if the Cu film 26 contacted the polishing composition.

EXAMPLE 6

Using the polishing machine shown in FIG. 3 and a polishing composition, a silicon wafer on which a Cu film was deposited was held upside down by the substrate holder 5 so that the Cu film opposed the polishing pad 2 (trade mark: IC1000, manufactured by Roder Nitta Co., Ltd.), and then the wafer was pressed against the polishing pad 2 by the supporting axial 4 so as to apply a load of 500 g/cm$^2$, to the polishing pad 2. While the turn table 1 and the holder 5 were rotated at rotating rates of 103 rpm and 100 rpm, respectively, in the same direction, the copper-based metal polishing composition was supplied from the supplying tube 3 to the polishing pad 2 at a flow speed of 50 mL/minute to polishing the Cu film.

The copper-based metal polishing composition used was a composition wherein 2-quinoline carboxylic acid (quinaldinic acid), lactic acid, ammonium dodecyl sulphate, polyvinyl pyrrolidone (PVP), hydrogen peroxide, colloidal silica, colloidal alumina having an average primary particle size of 20 nm, and water were mixed in the proportion shown in Table 1 described below.

Moreover, in the same manner as under the conditions for the cu film except that a silicon wafer in which on its surface an oxide film was grown was an object to be polished, the oxide film was polished for 5 minutes.

Furthermore, in the same manner as under the conditions for the Cu film except that a silicon wafer in which on its surface a silicon nitride film (SiN film) was grown was an object to be polished, the SiN film was polished for 5 minutes.

In these polishing treatments, the rates of polishing the Cu film, the oxide film and the SiN film were measured. From these polishing rates, selectivity ratio of the Cu film to the oxide film and that of the Cu film to the SiN film were also calculated. These results are shown in Table 1 described below.

EXAMPLES 7 TO 11

A Cu film, an oxide film, and an SiN film on a silicon wafer were polished, respectively, in the same manner as in Example 6 except that as the copper based metal polishing composition, there were used compositions wherein 2-quinoline carboxylic acid (quinaldinic acid), ammonium dodecylsulphate, polyvinyl pyrrolidone (PVP), hydrogen peroxide, colloidal silica, colloidal alumina having an average primary particle size of 20 nm, and water were mixed in the proportion shown in Table 1 described below. The rates of polishing these films were then measured. From these polishing rates, selectivity ratio of the Cu film to the oxide film and that of the Cu film to the SiN film were also calculated. These results are shown in Table 1 described below.

COMPARATIVE EXAMPLE 2

A Cu film, an oxide film, and an SiN film on a silicon wafer were polished, respectively, in the same manner as in Example 6 except that as the copper-based metal polishing composition, there were used a composition having a proportion shown in Table 1. The rates of polishing these films were then measured. From these polishing rates, selectivity ratio of the Cu film to the oxide film and that of the Cu film to the SiN film were also calculated. These results are shown in Table 1 described below.

TABLE 1

| | | Example 6 | Example 7 | Example 8 |
|---|---|---|---|---|
| Copper-based metal polishing composition | Quinaldinic acid (wt %) | 0.67 | 0.67 | 0.67 |
| | Lactia acid (wt %) | 0 | 0.67 | 0.80 |
| | Ammonium dodecylsulphate (wt %) | 0.57 | 0.57 | 0.57 |
| | PVP (wt %) | 0.4 | 0.4 | 0.4 |
| | Hydroge peroxide solution (wt %) | 13.3 | 13.3 | 13.3 |
| | Colloidal silica (wt %) | 4.4 | 4.4 | 4.4 |
| | Colloidal alumina (wt %) | 1.47 | 1.47 | 1.47 |
| Polishing conditions | Polishing load (g/cm$^2$) | 500 | 500 | 500 |
| | Amount of the polishing composition (mL/min) | 50 | 50 | 50 |
| | Rotating rate (rpm) (table/holder) | 103/100 | 103/100 | 103/100 |
| | Time for polishing copper (min) | 1 | 1 | 1 |
| | Time for polishing the oxide film (min) | 5 | 5 | 5 |
| | Time for polishing the SiN film (min) | 5 | 5 | 5 |
| Evaluation | Rate of polishing copper (nm/min) | 92 | 162 | 148 |
| | Rate of polishing the oxide film (nm/min) | 27 | 4.3 | 3.3 |
| | Rate of polishing the SiN film (nm/min) | 2.7 | 0.9 | 1.1 |
| | Selectivity ratio of the Cu film to the oxide film | 3.4 | 38.0 | 45.3 |
| | Selectivity ratio of the Cu film to the SiN film | 34.3 | 178.2 | 136.0 |

| | | Example 9 | Example 10 | Example 11 | Comparative Example 2 |
|---|---|---|---|---|---|
| Copper-based metal polishing composition | Quinaldinic acid (wt %) | 0.67 | 0.67 | 0.67 | 0 |
| | Lactia acid (wt %) | 0.93 | 1.07 | 1.20 | 0.80 |
| | Ammonium dodecylsulphate (wt %) | 0.57 | 0.57 | 0.57 | 0.57 |
| | PVP (wt %) | 0.4 | 0.4 | 0.4 | 0.4 |
| | Hydroge peroxide solution (wt %) | 13.3 | 13.3 | 13.3 | 13.3 |
| | Colloidal silica (wt %) | 4.4 | 4.4 | 4.4 | 4.4 |
| | Colloidal alumina (wt %) | 1.47 | 1.47 | 1.47 | 1.47 |
| Polishing conditions | Polishing load (g/cm$^2$) | 500 | 500 | 500 | 500 |
| | Amount of the polishing composition (mL/min) | 50 | 50 | 50 | 50 |
| | Rotating rate (rpm) (table/holder) | 103/100 | 103/100 | 103/100 | 103/100 |
| | Time for polishing copper (min) | 1 | 1 | 1 | 1 |
| | Time for polishing the oxide film (min) | 5 | 5 | 5 | 5 |
| | Time for polishing the SiN film (min) | 5 | 5 | 5 | 5 |

TABLE 1-continued

| Evaluation | Rate of polishing copper (nm/min) | 155 | 605 | 1209 | 589 |
|---|---|---|---|---|---|
| | Rate of polishing the oxide film (nm/min) | 21.6 | 6.7 | 7.3 | 1.8 |
| | Rate of polishing the SiN film (nm/min) | 1.3 | 1.1 | 2.1 | 2.3 |
| | Selectivity ratio of the Cu film to the oxide film | 7.2 | 89.7 | 165.8 | 331.9 |
| | Selectivity ratio of the Cu film to the SiN film | 121.6 | 530.0 | 575.6 | 258.5 |

As is clear from Table 1, the rate of polishing copper was larger, and the selectivity ratio of the Cu film to the oxide film and that of the Cu film to the SiN film were also higher in Examples 7 to 11, which comprised 2-quinoline carboxylic acid (quinaldinic acid) as a first organic acid, hydrogen peroxide as an oxidizing agent, colloidal silica and colloidal alumina as abrasive grains, water, and further lactic acid as a second organic acid than in Example 6 using only 2-quinoline carboxylic acid (quinaldinic acid) as an organic acid.

On the other hand, the polishing composition of Comparative Example 2 using only lactic acid as an organic acid had a large rate of polishing Cu, but polishing caused by this composition was based mainly on chemical etching. Thus, even after polishing by means of the polishing machine, etching of Cu advanced. As a result, it becomes difficult to form embedded wiring with high accuracy even if this polishing composition is applied to etch back treatment of Cu.

EXAMPLE 12

The Cu film, the oxide film and the SiN film on the silicone wafer were respectively polished in the same manner as in Example 6 except that there was used, as the copper-based metal polishing composition, a composition comprising 0.67% by weight of 2-quinoline carboxylic acid (quinaldinic acid), 0.14% by weight of oxalic acid, 0.57% by weight of ammonium dodecyl sulphate, 0.4% by weight of polyvinylpyyrolidone (PVP), 13.3% by weight of hydrogen peroxide, 4.4% by weight of colloidal silica, 1.47% by weight of colloidal alumina having an average primary particle size of 20 nm, and water as a balance. The rates of polishing these films were measured. The selectivity ratio of the Cu film to the oxide film and the selectivity ratio thereof to the SiN film were obtained from these polishing rates.

As a result, the rate of polishing copper, that of polishing the oxide film and that of the SiN film were 170 nm/min., 5 nm/min., and 2 nm/min., respectively. The selectivity ratio of the Cu film to the oxide film was 34 and the selectivity ratio thereof to the SiN film was 85. It can be understood that the rate of polishing copper was large, and further both the selectivity ratio of the Cu film to the oxide film and the selectivity ratio thereof to the SiN film were high.

EXAMPLE 13

As shown FIG. 5A, a $SiO_2$ film 22 as an interlayer dielectric, which had a thickness of, for example, 1000 nm, was first deposited by a CVD method on a silicon substrate 21 in which, in its surface, diffusion layers such as sources and drains not illustrated were formed. Thereafter, plural trenches 23 having a depth of 500 nm and a shape corresponding to wiring layers were formed inside the $SiO_2$ film 22 by photo-etching technique. Subsequently, as shown in FIG. 5B, a conductive barrier layer 24 of TiN and of 15 nm thickness and a Cu film 25 of 600 nm thickness were deposited in this order on the $SiO_2$ film 22 including the trenches 23.

Next, the substrate 21 shown in FIG. 5B was held upside down by the substrate holder 5 in the polishing machine shown in FIG. 3. The substrate was then pressed against the polishing pad 2 (trade name: IC1000, manufactured by Roder Nitta Co., Ltd.) by the supporting axial 4 of the holder 5 so as to apply a load of 500 g/cm$^2$, to the polishing pad 2. While the turn table 1 and the holder 5 were rotated at rates of 103 rpm and 100 rpm, respectively, in the same direction, a copper-based metal polishing composition was supplied at a rate of 50 ml/minute from the supplying tube 3 to the polishing pad 2. Thus, the Cu film 25 and the barrier layer 24 deposited on the substrate 21 were polished until the surface of the $SiO_2$ film 22 was exposed. As this copper-based metal polishing composition, there was used a composition comprising 0.67% by weight of 2-quinoline carboxylic acid (quinaldinic acid), 1.2% by weight of lactic acid, 0.57% by weight of ammonium dodecyl sulphate, 0.4% by weight of polyvinylpyyrolidone, 13.3% by weight of hydrogen peroxide, 4.4% by weight of colloidal silica and 1.47% by weight of colloidal alumina having an average primary particle size of 20 nm, and water. In this polishing step, when the polishing composition contacted the Cu film, the composition caused no etching of the Cu film. In the polishing by means of the polishing pad, its polishing rate was about 605 nm/minute. Therefore, in the polishing step the convex Cu film 25 shown in FIG. 5B was preferentially polished from its surface mechanically contacting the polishing pad, and further the exposed barrier layer 24 was polished. That is, etch back treatment was performed. Consequently, the barrier layer 24 remained inside the trenches 23 as shown in FIG. 5C, and additionally inside the trenches 23 covered with the barrier layer 24 was formed an embedded Cu wiring layer 26 having the same level as the surface of the $SiO_2$ film 22.

Moreover, the embedded Cu wiring 26 having on its surface a few injuries was formed by using the mixture of colloidal alumina and colloidal silica as the abrasive grain.

Furthermore, after the load against the polishing pad 2 by the holder 5 in the polishing machine was released and rotation of the turn table 1 and the holder 5 was stopped, dissolution (etching) was not caused even if the Cu wiring film 26 contacted the polishing composition.

EXAMPLE 14

A $SiO_2$ film as an interlayer dielectric, which had a thickness of, for example, 1000 nm, was first deposited by a CVD method on a silicon substrate in which, in its surface, diffusion layers such as sources and drains not illustrated were formed. Thereafter, plural trenches having a depth of 500 nm and a shape corresponding to wiring layers were formed inside the $SiO_2$ film by photo-etching technique.

Subsequently, a conductive barrier layer of TiN and of 15 nm thickness and a Cu film of 600 nm thickness were deposited in this order on the $SiO_2$ film including the trenches.

Next, the substrate was held upside down by the substrate holder 5 in the polishing machine shown in FIG. 3. The substrate was then pressed against the polishing pad 2 (trade name: IC1000, manufactured by Roder Nitta Co., Ltd.) by the supporting axial 4 of the holder 5 so as to apply a load of 500 g/cm² to the polishing pad 2. While the turn table 1 and the holder 5 were rotated at rates of 103 rpm and 100 rpm, respectively, in the same direction, a polishing composition was supplied at a rate of 50 ml/minute from the supplying tube 3 to the polishing pad 2. Thus, the Cu film and the barrier layer deposited on the substrate were polished until the surface of the $SiO_2$ film was exposed. As this copper-based metal polishing composition, there was used a composition comprising 0.67% by weight of 2-quinoline carboxylic acid (quinaldinic acid), 1.2% by weight of lactic acid, 0.57% by weight of ammonium dodecylsulphate, 0.4% by weight of polyvinylpyyrolidone, 13.3% by weight of hydrogen peroxide, 4.4% by weight of colloidal silica and 1.47% by weight of colloidal alumina having an average primary particle size of 20 nm, and water. In this polishing step, when the polishing composition contacted the Cu film, the composition caused no etching of the Cu film. In the polishing by means of the polishing pad, its polishing rate was about 1200 nm/minute. Therefore, in the polishing step the convex Cu film was preferentially polished from its surface mechanically contacting the polishing pad, and further the exposed barrier layer was polished. That is, etch back treatment was performed. Consequently, the barrier layer remained inside the trenches, and additionally inside the trenches covered with the barrier layer was formed an embedded wiring layer having the same level as the surface of the $SiO_2$ film.

Moreover, the copper-based metal polishing composition of the aforementioned composition containing the surfactant had a high polishing selectivity of Cu to $SiO_2$, thereby making it possible to prevent thinning of the $SiO_2$ film (interlayer dielectric) in the etch back step.

Furthermore, after the load against the polishing pad 2 by the holder 5 in the polishing machine was released and rotation of the turn table 1 and the holder 5 was stopped, dissolution (etching) was not caused even if the Cu wiring film contacted the polishing composition.

Next, the substrate on which the embedded wiring layer was formed was subjected to ultrasonic washing with use of pure water. Such washing made it possible to remove polished pieces of Cu remaining on the surface of the $SiO_2$ film (interlayer dielectric), polished pieces of the Cu complex, and organic acids such as 2-quinoline carboxylic acid and lactic acid, and clean the surface of the $SiO_2$ film.

Therefore, according to Example 14, it was possible to form the embedded Cu wiring layer having the same thickness as the depth of the interlayer dielectric inside its trenches so that the Cu wiring layer had the same level as the surface of the interlayer dielectric and to flatten the surface of the substrate in which the wiring layer was formed. The Cu wiring layer 26 was embedded in the trench 23 through the barrier layer 24, such as a TiN layer, having barrier ability against the diffusion of copper. Therefore, it was possible to prevent copper from diffusing from the wiring layer 26 into the $SiO_2$ film 22 to reach and pollute the silicon substrate 21. Moreover, the Cu wiring layer 26 was formed by the etch back step using the polishing composition having the aforementioned composition containing the surfactant, and then it was subjected to ultrasonic washing with use of pure water, so that the surface of the dielectric interlayer was easily cleaned by the action of the surfactant in the polishing composition. For this reason, it was possible to manufacture a semiconductor device with high reliability, which has the embedded Cu wiring layer having an essentially low resistance of Cu.

EXAMPLE 15

Figure 6A:
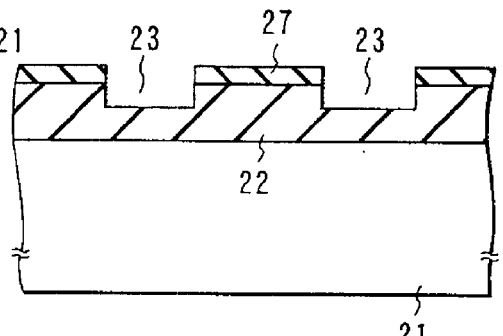
FIGS. 6A to 6C are cross sections illustrating a process for manufacturing a semiconductor device in Example 15 of the present invention.
Figure 6B:
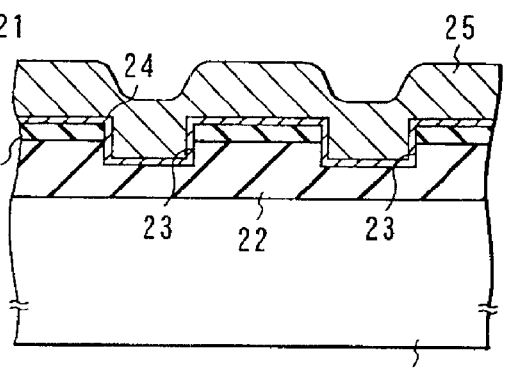

First, a $SiO_2$ film 22 of e.g., 800 nm thickness and a $Si_3N_4$ film 27 of 200 nm thickness as a polishing stopper film were deposited in this order on a silicon substrate 21 having, in its surface, non-illustrated diffusion layers such as a source and a drain, by CVD, to form interlayer dielectrics, as shown in FIG. 6A. Thereafter, trenches 23 corresponding to a shape of a wiring layer and a depth of 500 nm were made in the $Si_3N_4$ film 27 and $SiO_2$ film 22 by a photo-etching technique. As shown in FIG. 6B, subsequently, a conductive barrier layer 24 comprising TiN and having a thickness of 15 nm and a Cu film 25 of 600 nm thickness were deposited in this order on the $Si_3N_4$ film 27 including the trenches 23.

Next, a substrate 21 shown in FIG. 6B was turned upside down and then held by the substrate holder 5 of the polishing machine shown in FIG. 3. The substrate was then pressed against the polishing pad 2 (trade name: SUBA800, manufactured by Roder Nitta Co., Ltd.) by the supporting axial 4 of the holder 5 so as to apply a load of 300 g/cm² to the polishing pad 2. While the turn table 1 and the holder 5 were rotated at rates of 100 rpm, respectively, in the same direction, a polishing composition was supplied at a rate of 12.5 ml/minute from the supplying tube 3 to the polishing pad 2. Thus, the Cu film 25 and the barrier layer 24 deposited on the substrate 21 were polished until the surface of the $Si_3N_4$ film 27 was exposed. As the polishing composition, there was used a composition comprising 0.67% by weight of 2-quinoline carboxylic acid (quinaldinic acid), 1.2% by weight of lactic acid, 0.57% by weight of ammonium dodecylsulphate, 0.4% by weight of polyvinylpyyrolidone (PVP), 13.3% by weight of hydrogen peroxide, 4.4% by weight of colloidal silica and 1.47% by weight of colloidal alumina having an average primary particle size of 20 nm, and water. In this polishing step, when the polishing composition contacted the Cu film, the composition caused no etching of the Cu film. In the polishing by means of the polishing pad, its polishing rate was about 1200 nm/minute. Therefore, the convex Cu film 25 shown in FIG. 6B was preferentially polished from its surface mechanically contacting the polishing pad, and further the exposed barrier layer 24 was polished. That is, etch back was performed.

Figure 6C:
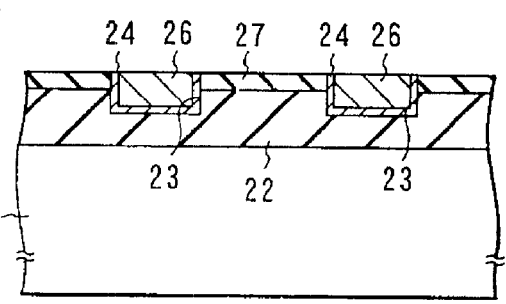

Consequently, as shown in FIG. 6C, the barrier layer 24 remained inside the trenches 23, and additionally inside the trenches 23 covered with the barrier layer 24 was formed an embedded wiring layer 26 having the same level as the surface of the $Si_3N_4$ film 27. The load to the polishing pad 2 by the holder 5 of the polishing machine was released and the rotation of the turn table 1 and the holder 5 was stopped. Thereafter, even if the Cu wiring layer 26 was brought into contact with the polishing composition, the layer was not dissolved (etched). Since the $Si_3N_4$ film 27 functioning as the stopper film was formed at the surface side of the interlayer dielectrics in the polishing step using the polishing composition containing abrasive grains, the thinning thereof was able to be reduced in the etch back step. It is therefore possible to manufacture a semiconductor device having the interlayer dielectrics having a good breakdown voltage.

EXAMPLE 16

Figure 7A:
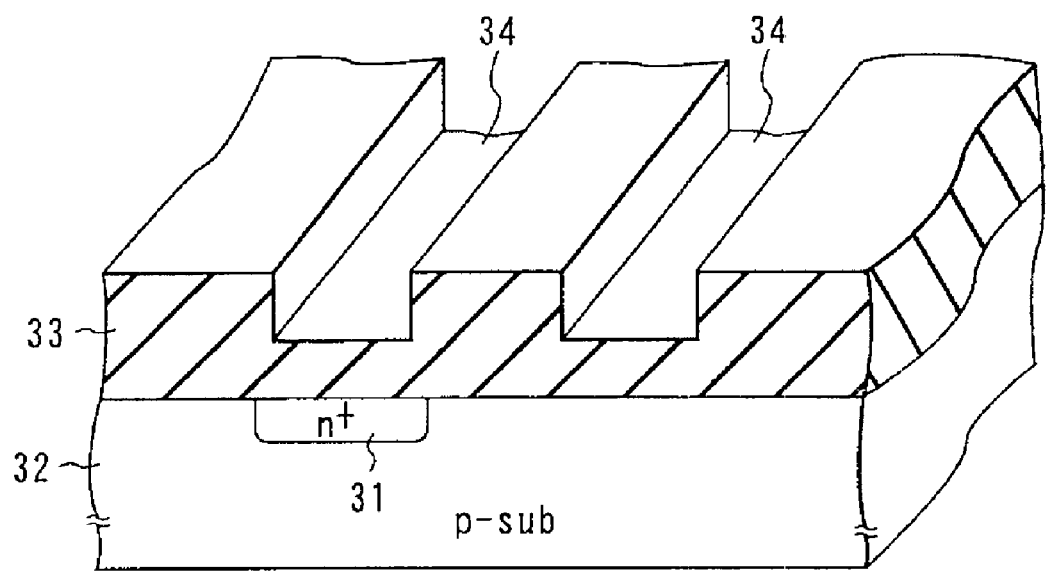
FIGS. 7A to 7D are cross sections illustrating a process for manufacturing a semiconductor device in Example 16 of the present invention.
Figure 7B:
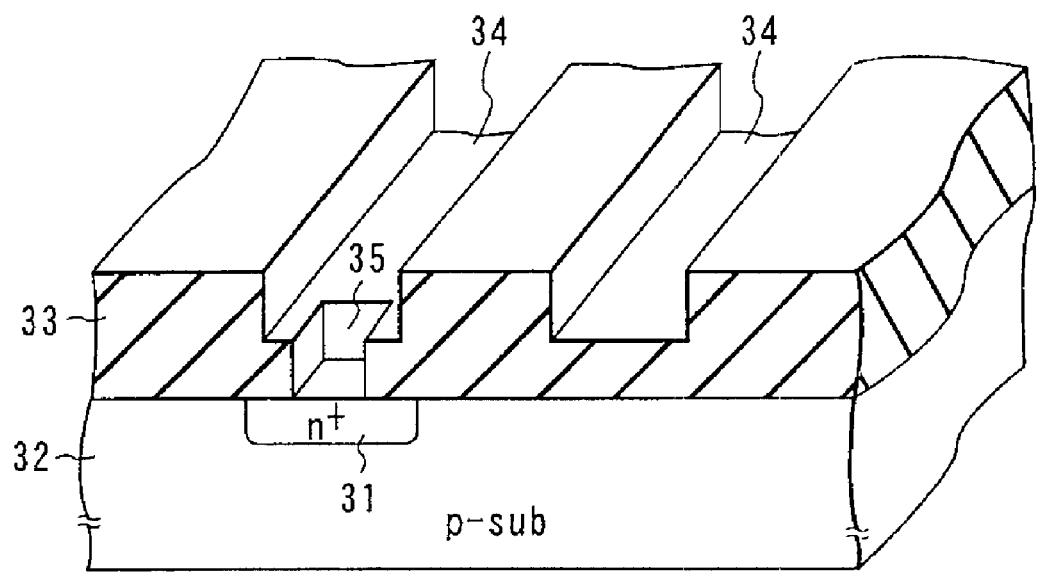

First, a $SiO_2$ film 33 of e.g., 800 nm thickness was deposited on a silicon substrate 32 having, in its surface, an n+ type diffusion layer 31 by CVD, to form an interlayer dielectric, as shown in FIG. 7A. Thereafter, trenches 34 corresponding to a shape of a wiring layer, a depth of 500 nm and a width of 400 nm were made in the $SiO_2$ film 33 by a photo-etching technique. As shown in FIG. 7B, subsequently, an opening 35 reached to the n+diffusion layer 31 was made by selectively removing a portion of the $SiO_2$ film 33, which was positioned at a part of the bottom of a given trench 34 among the trenches 34 by a photo-etching technique.

Figure 7C:
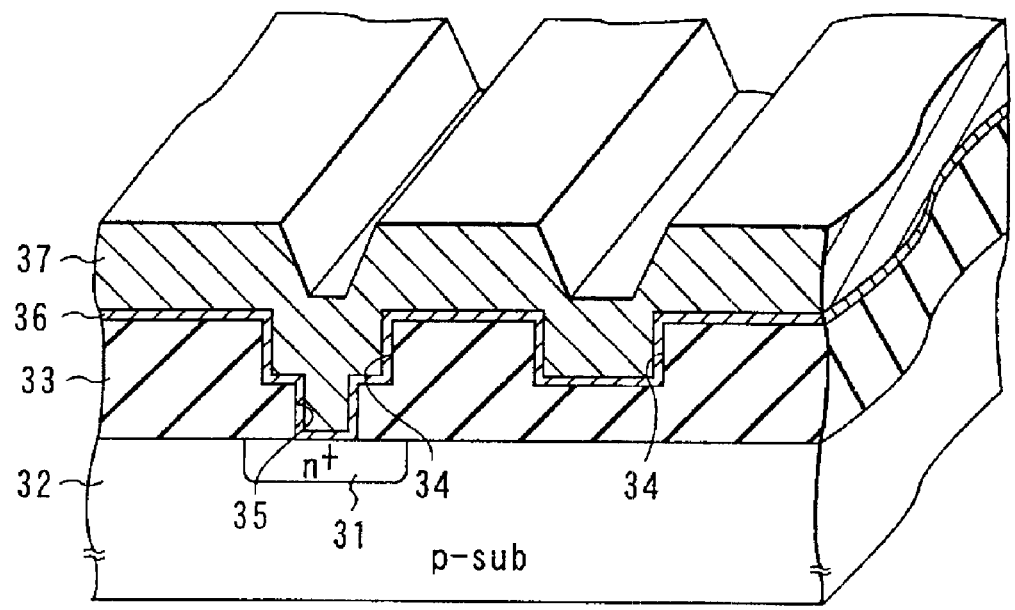

Next, as shown in FIG. 7C, a conductive barrier layer 36 having a thickness of 15 nm and comprising TiN and a Cu film 37 of 600 nm thickness were deposited in this order on the $SiO_2$ film 33 including the trenches 34, and the opening 35 by sputtering deposition.

Next, a substrate 32 shown in FIG. 7C was turned upside down and then held by the substrate holder 5 of the polishing machine shown in FIG. 3. The substrate was then pressed against the polishing pad 2 (trade name: SUBA800, manufactured by Roder Nitta Co., Ltd.) by the supporting axial 4 of the holder 5 so as to apply a load of 300 g/cm$^2$ to the polishing pad 2. While the turn table 1 and the holder 5 were rotated at rate of 100 rpm, respectively, in the same direction, a polishing composition was supplied at a rate of 12.5 ml/minute from the supplying tube 3 to the polishing pad 2. Thus, the Cu film 37 and the barrier layer 36 deposited on the substrate 21 were polished until the surface of the $SiO_2$ film 33 was exposed. As the polishing composition, there was used a composition comprising 0.67% by weight of 2-quinoline carboxylic acid (quinaldinic acid), 1.2% by weight of lactic acid, 0.57% by weight of ammonium dodecylsulphate, 0.4% by weight of polyvinylpyyrolidone (PVP), 13.3% by weight of hydrogen peroxide, 4.4% by weight of colloidal silica and 1.47% by weight of colloidal alumina having an average primary particle size of 20 nm, and water. In this polishing step, when the polishing composition contacted the Cu film, the composition caused no etching of the Cu film. In the polishing by means of the polishing pad, its polishing rate was about 1200 nm/minute. Therefore, the convex Cu film 37 shown in FIG. 7C was preferentially polished from its surface mechanically contacting the polishing pad, and further the exposed barrier layer 36 was polished. That is, etch back was performed.

Figure 7D:
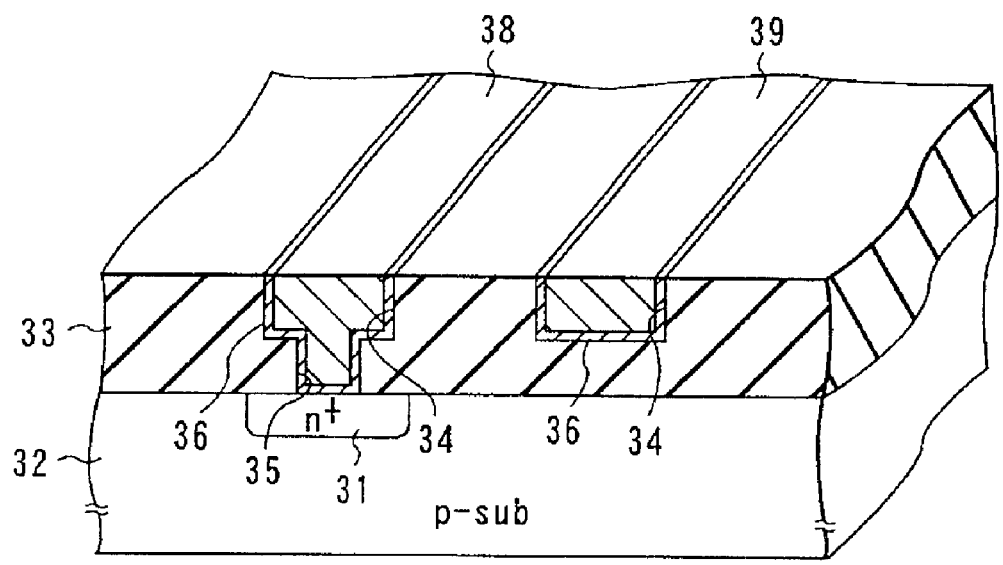

Consequently, as shown in FIG. 7D, the barrier layer 36 remained inside the trenches 34 and the opening 35, and additionally inside the trenches 34 and the opening 35 covered with the barrier layer 36 was formed a Cu wiring layer 38 having a dual damascene structure and having the same level as the surface of the $SiO_2$ film 33. Simultaneously, the barrier layer 36 remained inside the trenches 34, and additionally inside the trenches 34 covered with the barrier layer 36 was formed a Cu wiring layer 39 having the same level as the surface of the $SiO_2$ film 33.

The Cu wiring layer 38 having the dual damascene structure and the Cu wiring layer 39 were embedded in the $SiO_2$ film 33 through the barrier layer 36 having barrier ability against diffusion of copper, such as a TiN layer. Therefore, it was possible to prevent the phenomenon that copper diffuses from the wiring layers 38 and 39 to the $SiO_2$ film 33 to reach and pollute the silicon substrate 32.

The load to the polishing pad 2 by the holder 5 of the polishing machine was released and the rotation of the turn table 1 and the holder 5 was stopped. Thereafter, even if the Cu wiring layers 38 and 39 were brought into contact with the polishing composition, the layers were not dissolved (etched).

It was therefore possible to manufacture a reliable semiconductor device in which the Cu wiring layers 38 having a high-precision dual damascene structure and the Cu wiring layer 39 were formed, and pollution was avoided by action.

EXAMPLE 17

Figure 8A:
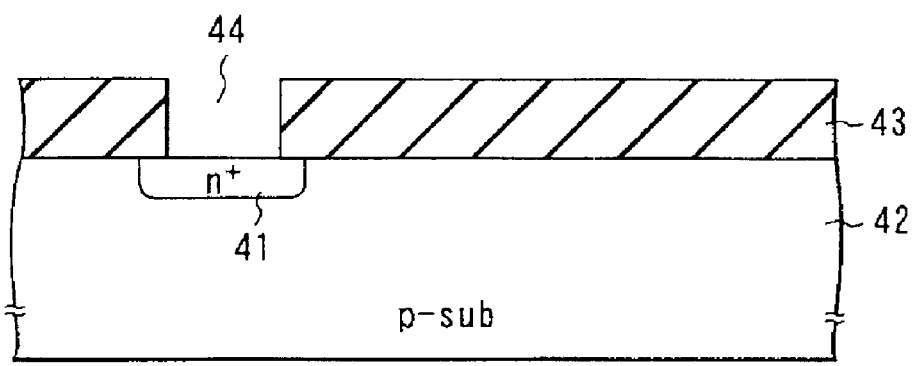
FIGS. 8A to 8F are cross sections illustrating a process for manufacturing a semiconductor device in Example 17 of the present invention.
Figure 8B:
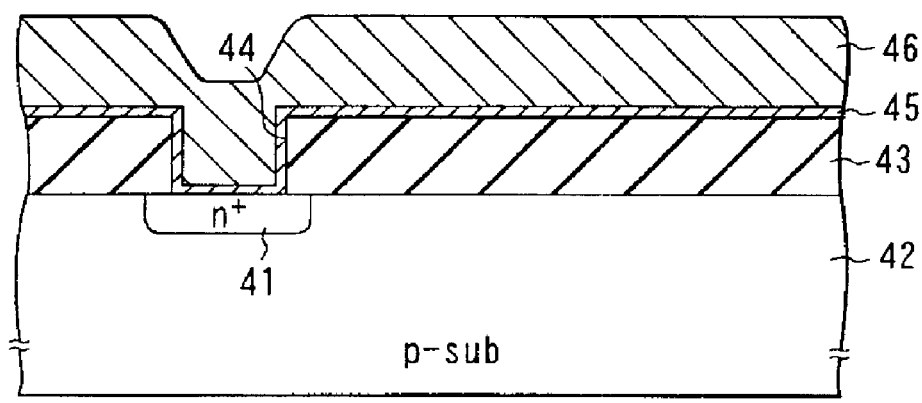

First, a $SiO_2$ film 43 of e.g., 1000 nm thickness, as a first insulating film, was deposited on a p type silicon substrate 42 having, in its surface, an n$^+$ type diffusion layer 41 by CVD, as shown in FIG. 8A. Thereafter, a first opening (first via hole) 44 was made in the $SiO_2$ film 43 corresponding to the diffusion layer 31 by a photo-etching technique. As shown in FIG. 8B, subsequently, a conductive barrier layer 45 having a thickness of 20 nm and comprising TiN was deposited on the $SiO_2$ film 43 including the first via hole 44 by sputtering deposition. Thereafter, a first Cu film 46 of 1100 nm thickness, as a first conductive material film, was deposited by sputtering deposition.

Next, a substrate 42 shown in FIG. 8B was turned upside down and then held by the substrate holder 5 of the polishing machine shown in FIG. 3. The substrate was then pressed against the polishing pad 2 (trade name: SUBA800, manufactured by Roder Nitta Co., Ltd.) by the supporting axial 4 of the holder 5 so as to apply a load of 300 g/cm$^2$ to the polishing pad 2. While the turn table 1 and the holder 5 were rotated at rate of 100 rpm, respectively, in the same direction, a polishing composition was supplied at a rate of 12.5 ml/minute from the supplying tube 3 to the polishing pad 2. Thus, the first Cu film 46 and the barrier layer 45 deposited on the substrate 42 were polished until the surface of the $SiO_2$ film 43 was exposed. As the polishing composition, there was used a composition comprising 0.67% by weight of 2-quinoline carboxylic acid (quinaldinic acid), 1.2% by weight of lactic acid, 0.57% by weight of ammonium dodecylsulphate, 0.4% by weight of polyvinylpyyrolidone (PVP), 13.3% by weight of hydrogen peroxide, 4.4% by weight of colloidal silica and 1.47% by weight of colloidal alumina having an average primary particle size of 20 nm, and water. In this polishing step, when the polishing composition contacted the first Cu film, the composition caused no etching of the film. In the polishing by means of the polishing pad, its polishing rate was about 1200 nm/minute. Therefore, the convex first Cu film 46 shown in FIG. BB was preferentially polished from its surface mechanically contacting the polishing pad, and further the exposed barrier layer 45 was polished. That is, etch back was performed.

Figure 8C:
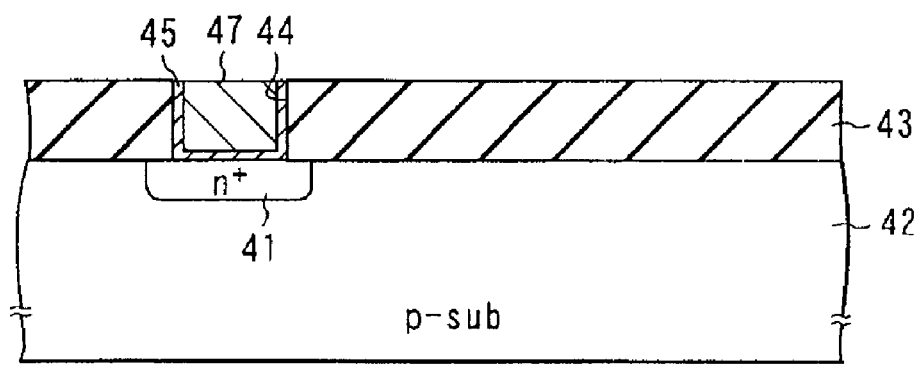

Consequently, as shown in FIG. 8C, the barrier layer 45 remained inside the first via hole 44, and additionally inside the via hole 44 covered with the barrier layer 45 was formed a first via fill 47 having the same level as the surface of the $SiO_2$ film 43. The above-mentioned polishing composition containing the surfactant had a high selectivity for polishing Cu and $SiO_2$. Therefore, the thinning of the $SiO_2$ film 43 was able to be prevented in the etch back step. The load to the polishing pad 2 by the holder 5 of the polishing machine was released and the rotation of the turn table 1 and the holder 5 was stopped. Thereafter, even if the via fill 47 was brought into contact with the polishing composition, etching did not advance. The substrate after the formation of the via fill 47 was subjected to ultrasonic washing using pure water to clean up the surface of the $SiO_2$ film 43.

Figure 8D:
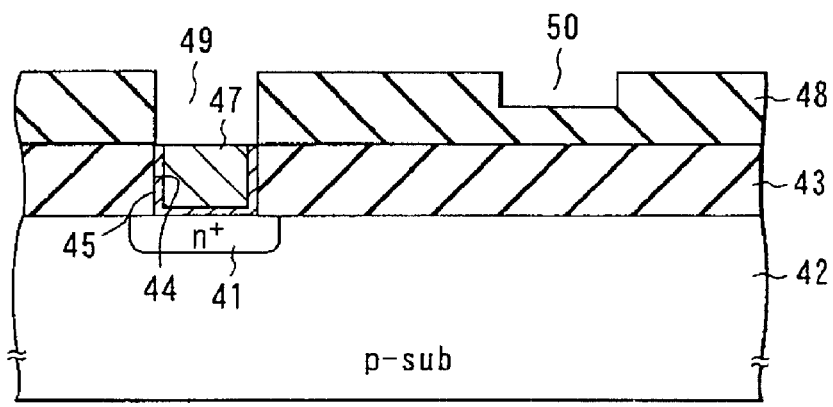
Figure 8E:
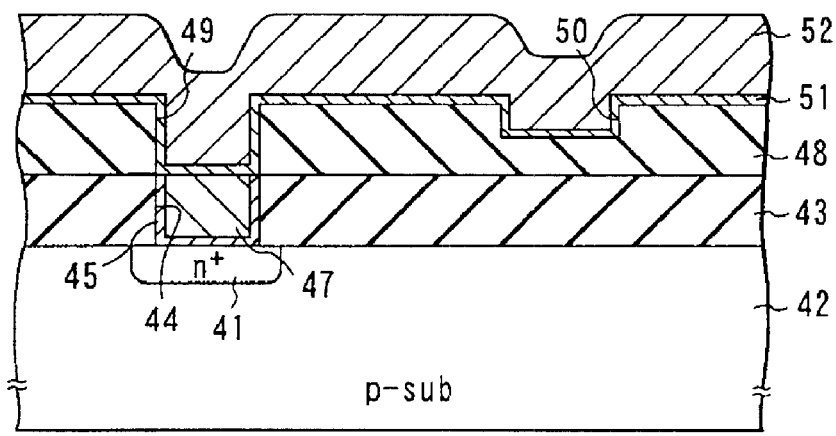

Next, a $SiO_2$ film 48 of e.g., 1000 nm thickness, as a second insulating film, was deposited on the $SiO_2$ film 43 including the first via fill 47 by CVD, as shown in FIG. 8D. Thereafter, a second opening (second via hole) 49 was formed in the SiO₂ film 48 positioned on the via fill 37 by a photo-etching technique. Furthermore, a trench 50 corresponding to a shape of a wiring layer and a depth of 400 nm was formed in the SiO₂ film 48 by a photo-etching technique. As shown in FIG. 8E, subsequently, a conductive barrier layer 51 having a thickness of 15 nm and comprising TiN and a second Cu film 52 of 900 nm thickness, as a second conductive material film, were deposited on the SiO₂ film 48 including the second via hole 49 and the trench 50 by sputtering deposition.

Next, a substrate 42 shown in FIG. 8E was turned upside down and then held by the substrate holder 5 of the polishing machine shown in FIG. 3. The substrate was then pressed against the polishing pad 2 (trade name: SUBA800, manufactured by Roder Nitta Co., Ltd.) by the supporting axial 4 of the holder 5 so as to apply a load of 300 g/cm² to the polishing pad 2. While the turn table 1 and the holder 5 were rotated at rate of 100 rpm, respectively, in the same direction, a polishing composition was supplied at a rate of 12.5 ml/minute from the supplying tube 3 to the polishing pad 2. Thus, the second Cu film 52 and the barrier layer 51 deposited on the substrate 42 were polished until the surface of the SiO₂ film 48 was exposed.

Figure 8F:
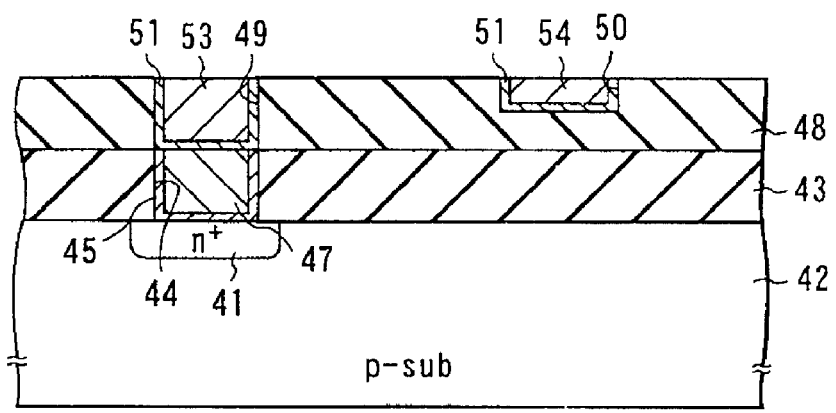

Consequently, the convex second Cu film shown in FIG. 8E was preferentially polished from its surface mechanically contacting the polishing pad. That is, etch back was performed. By such etch back, as shown in FIG. 8F, the barrier layer 51 remained inside the second via hole 49 positioned on the first via fill 47, and additionally inside the via hole 49 covered with the barrier layer 51 was formed a second via fill 53 comprising Cu and having the same level as the surface of the SiO₂ film 48. Simultaneously, inside the trench 50 was formed an embedded Cu wiring layer 54 having the same level as the surface of the SiO₂ film 48. The above-mentioned polishing composition containing the surfactant had a high selectivity for polishing Cu and SiO₂. Therefore, the thinning of the SiO₂ film 48 was able to be prevented in the etch back step. The load to the polishing pad 2 by the holder 5 of the polishing machine was released and the rotation of the turn table 1 and the holder 5 was stopped. Thereafter, even if the second via fill 53 comprising Cu and the wiring layer 54 were brought into contact with the polishing composition, etching did not advance.

According to Example 17, therefore, it was possible to manufacture a reliable semiconductor device having a multilayer structure which had the SiO₂ films 43 and 48 as the first and second interlayer dielectrics; in which the first via fill 47 comprising Cu and having the same level as the surface of the SiO₂ film 43 was formed inside the SiO₂ 43; and in which the Cu wiring layer 54 and the second via fill 53 having the same level as the surface of the SiO₂ film 48, connecting with the first via fill 47 and comprising Cu were formed inside the SiO₂ film 48. The semiconductor device was further as follows. Its surface was made flat, and the diffusion of copper from the first and second via fills 47 and 53, and the wiring layer 54 was prevented by the barrier layers 45 and 51 having barrier ability against the diffusion of copper.

EXAMPLE 18

Figure 9A:
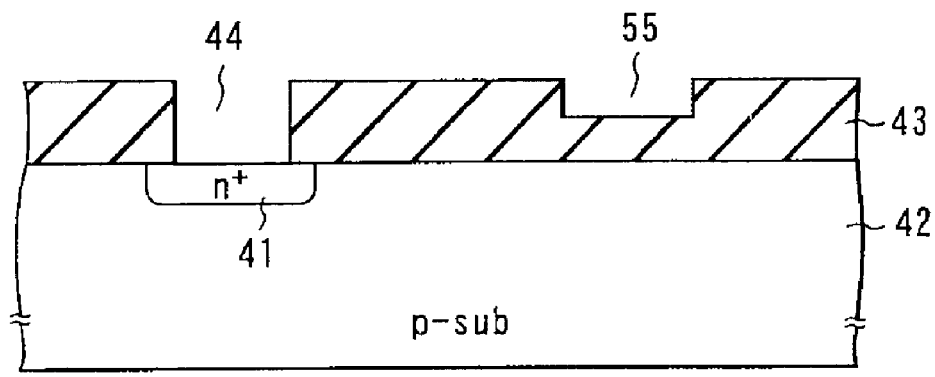
FIGS. 9A to 9F are cross sections illustrating a process for manufacturing a semiconductor device in Example 18 of the present invention.
Figure 9B:
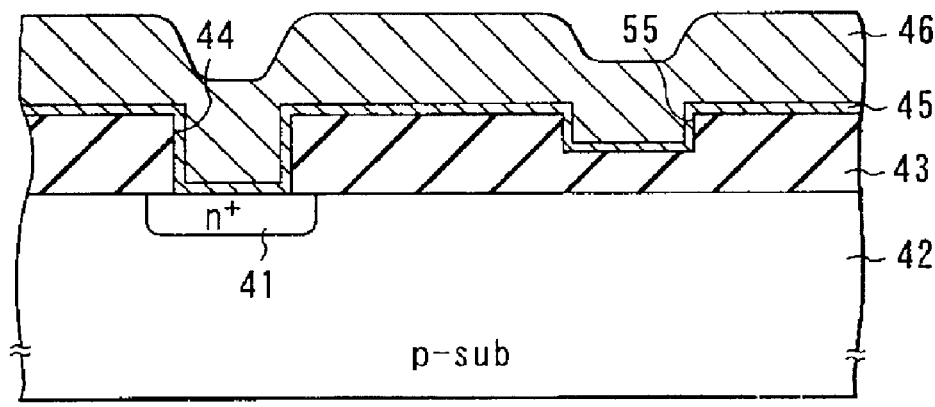

First, a SiO₂ film 43 of e.g., 1100 nm thickness, as a first insulating film, was deposited on a p type silicon substrate 42 having, in its surface, an n+ type diffusion layer 41 by CVD, as shown in FIG. 9A. Thereafter, a first opening (first via hole) 44 was formed in the SiO₂ film 43 corresponding to the diffusion layer 31 by a photo-etching technique. A trench 55 corresponding to a shape of a wiring layer and a depth of 400 nm was made in the first SiO₂ film 43 by a photo-etching technique. As shown in FIG. 9B, subsequently, a conductive barrier layer 45 having a thickness of 20 nm and comprising TiN was deposited on the SiO₂ film 43 including the first via hole 44 and the trench 55 by sputtering deposition. Thereafter, a first Cu film 46 of 1100 nm thickness, as a first conductive material film, was deposited by sputtering deposition.

Next, a substrate 42 shown in FIG. 8B was turned upside down and then held by the substrate holder 5 of the polishing machine shown in FIG. 3. The substrate was then pressed against the polishing pad 2 (trade name: SUBA800, manufactured by Roder Nitta Co., Ltd.) by the supporting axial 4 of the holder 5 so as to apply a load of 300 g/cm² to the polishing pad 2. While the turn table 1 and the holder 5 were rotated at rate of 100 rpm, respectively, in the same direction, a polishing composition was supplied at a rate of 12.5 ml/minute from the supplying tube 3 to the polishing pad 2. Thus, the first Cu film 46 and the barrier layer 45 deposited on the substrate 42 were polished until the surface of the SiO₂ film 43 was exposed. As the polishing composition, there was used a composition comprising 0.67% by weight of 2-quinoline carboxylic acid (quinaldinic acid), 1.2% by weight of lactic acid, 0.57% by weight of ammonium dodecylsulphate, 0.4% by weight of polyvinylpyyrolidone (PVP), 13.3% by weight of hydrogen peroxide, 4.4% by weight of colloidal silica and 1.47% by weight of colloidal alumina having an average primary particle size of 20 nm, and water. In this polishing step, when the polishing composition contacted the first Cu film 46, the composition caused no etching of the film. In the polishing by means of the polishing pad, its polishing rate was about 1200 nm/minute. Therefore, the convex first Cu film 46 shown in FIG. 9B was preferentially polished from its surface mechanically contacting the polishing pad, and further the exposed barrier layer 45 was polished. That is, etch back was performed.

Figure 9C:
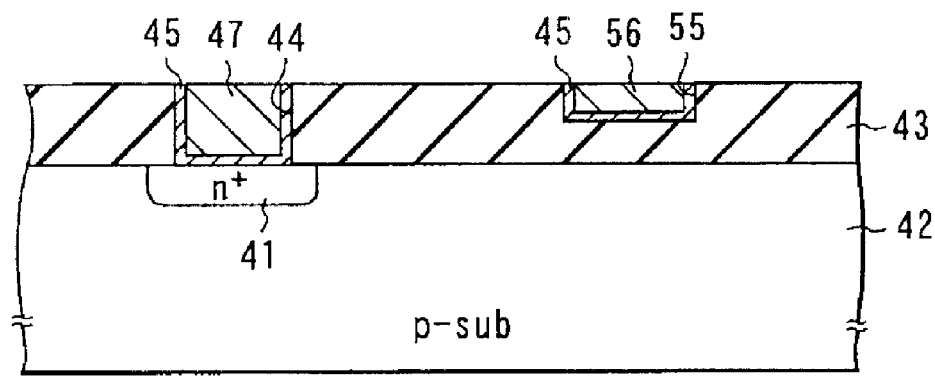

Consequently, as shown in FIG. 9C, the barrier layer 45 remained inside the first via hole 44, and additionally inside the via hole 44 covered with the barrier layer 45 was formed a first via fill 47 having the same level as the surface of the SiO₂ film 43 and comprising Cu. Simultaneously, the embedded Cu wiring layer 56 having the same level as the surface of the SiO₂ film 43 was formed inside the trench 55. The above-mentioned polishing composition containing the surfactant had a high selectivity for polishing Cu and SiO₂. Therefore, the thinning of the SiO₂ film 43 was able to be prevented in the etch back step. The load to the polishing pad 2 by the holder 5 of the polishing machine was released and the rotation of the turn table 1 and the holder 5 was stopped. Thereafter, even if the via fill 47 and the Cu wiring layer 56 were brought into contact with the polishing composition, etching did not advance. The substrate after the formation of the via fill 47 was subjected to ultrasonic washing using pure water to clean up the surface of the SiO₂ film 43.

Figure 9D:
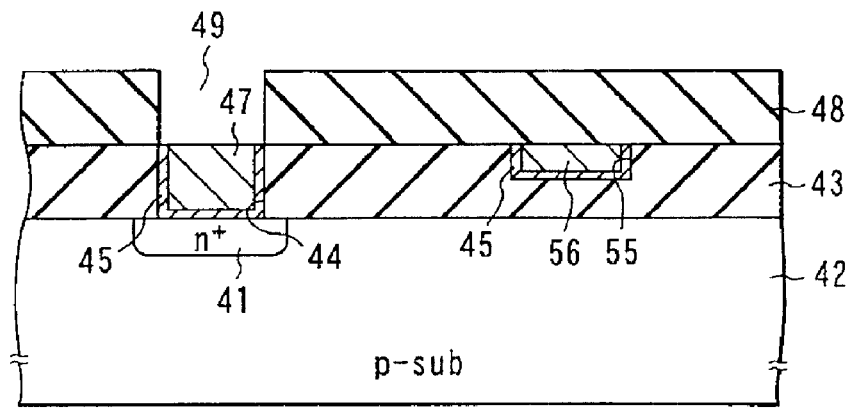
Figure 9E:
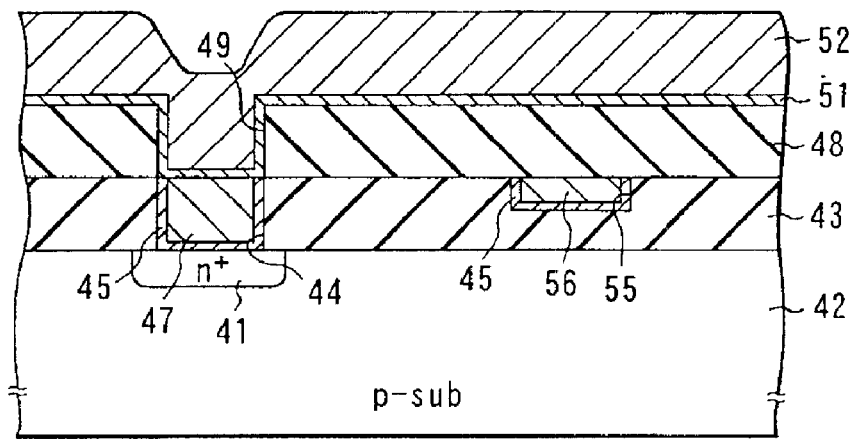

Next, a SiO₂ film 48 of e.g., 1000 nm thickness, as a second insulating film, was deposited on the SiO₂ film 43 including the first via fill 47 and the Cu wiring layer 56 by CVD, as shown in FIG. 9D. Thereafter, a second opening (second via hole) 49 was formed in the SiO₂ film 48 positioned on the via fill 37 by a photo-etching technique. As shown in FIG. 9E, subsequently, a conductive barrier layer 51 having a thickness of 15 nm and comprising TiN and a second Cu film 52 of 900 nm thickness, as a second conductive material film, were deposited on the SiO₂ film 48 including the second via hole 49 by sputtering deposition.

Next, a substrate 42 shown in FIG. 8E was turned upside down and then held by the substrate holder 5 of the polishing machine shown in FIG. 3. The substrate was then pressed against the polishing pad 2 (trade name: SUBA 800, manufactured by Roder Nitta Co., Ltd.) by the supporting axial 4 of the holder 5 so as to apply a load of 300 g/cm² to the polishing pad 2. While the turn table 1 and the holder 5 were rotated at rate of 100 rpm, respectively, in the same direction, a polishing composition was supplied at a rate of 12.5 ml/minute from the supplying tube 3 to the polishing pad 2. Thus, the second Cu film 52 and the barrier layer 51 deposited on the substrate 42 were polished until the surface of the $SiO_2$ film 48 was exposed.

Figure 9F:
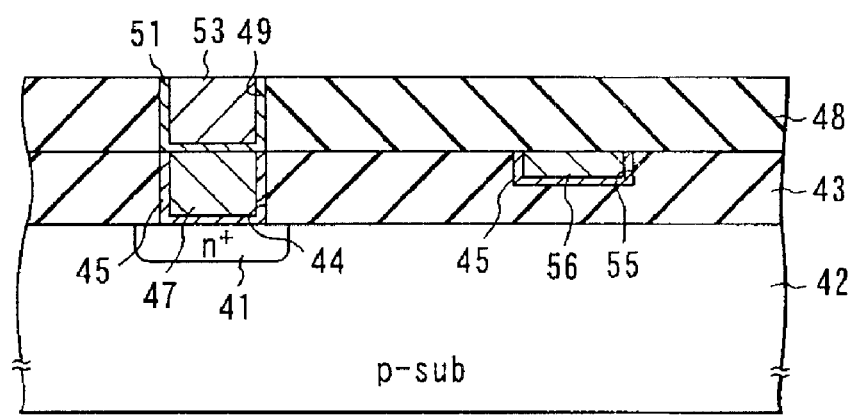

Consequently, the convex second Cu film 52 shown in FIG. 9E was preferentially polished from its surface mechanically contacting the polishing pad. That is, etch back was performed. By such etch back, as shown in FIG. 9F, the barrier layer 51 remained inside the second via hole 49 positioned on the first via fill 47, and additionally inside the via hole 49 covered with the barrier layer 51 was formed a second via fill 53 comprising Cu and having the same level as the surface of the $SiO_2$ film 48. The above-mentioned polishing composition containing the surfactant had a high selectivity for polishing Cu and $SiO_2$. Therefore, the thinning of the $SiO_2$ film 48 was able to be prevented in the etch back step. The load to the polishing pad 2 by the holder 5 of the polishing machine was released and the rotation of the turn table 1 and the holder 5 was stopped. Thereafter, even if the second via fill 53 comprising Cu was brought into contact with the polishing composition, etching did not advance.

According to Example 18, therefore, it was possible to manufacture a semiconductor device having a multilayer structure which the $SiO_2$ films 43 and 48 as the first and second interlayer dielectrics; in which the first via fill 47 comprising Cu and having the same level as the surface of the $SiO_2$ film 43 and the Cu wiring layer 56 were formed inside the $SiO_2$ 43; and in which the second via fill 53 having the same level as the surface of the $SiO_2$ film 48, connecting with the first via fill 47 and comprising Cu was formed inside the $SiO_2$ film 48. The semiconductor device was further as follows. Its surface was made flat, and the diffusion of copper from the first and second via fills 47 and 53, and the wiring layer 56 was prevented by the barrier layers 45 and 51 having barrier ability against the diffusion of copper.

EXAMPLE 19

Figure 10A:
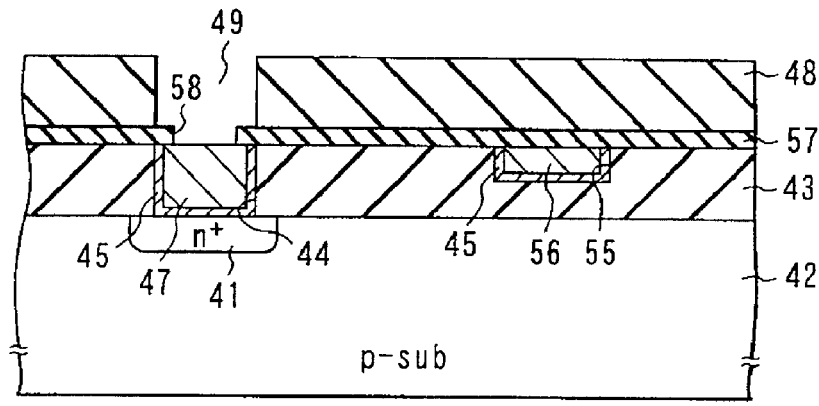
FIGS. 10A to 10C are cross sections illustrating a process for manufacturing a semiconductor device in Example 19 of the present invention.

In the same way as in Example 18, a first via fill 47 and an embedded Cu wiring layer 56 having the same level as the surface of a $SiO_2$ film 43 as a first insulating film were formed inside the $SiO_2$ film 43. As shown in FIG. 10A, thereafter, a silicon nitride ($Si_3N_4$) film 57 of 100 nm thickness was deposited on the $SiO_2$ film 43 including the first via fill 47 and the Cu wiring layer 56 by CVD, as shown in FIG. 10A. Thereafter, a through hole 58 was selectively opened in the $Si_3N_4$ film 57 positioned on the first via fill 47. A $SiO_2$ film 48 of, e.g., 1000 nm, as a second insulating film, was deposited by CVD, and then a second opening (second via hole) 49 was formed in the $SiO_2$ film 48 positioned on the first via fill 37 by a photo-etching technique.

Figure 10B:
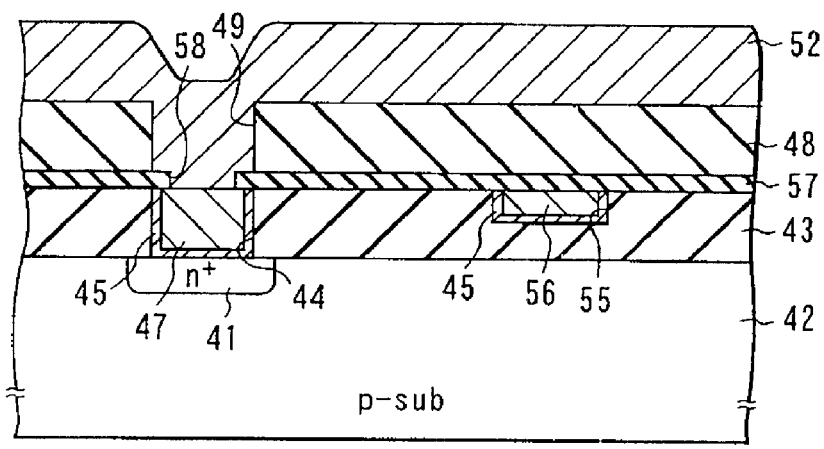
Figure 10C:
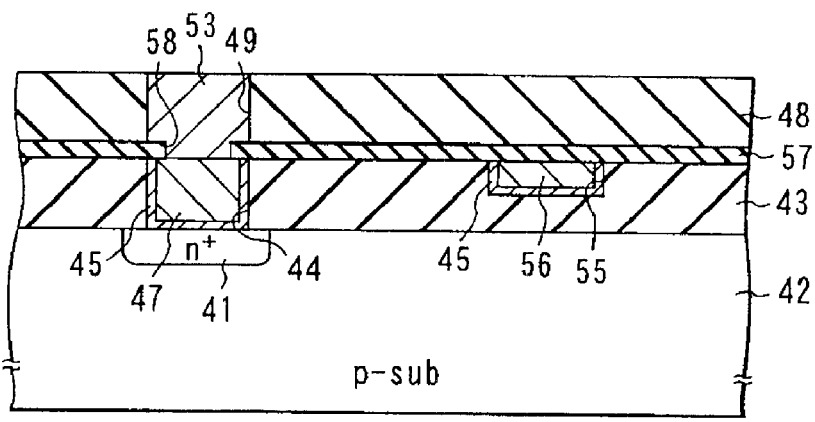

As shown in FIG. 10B, next, a second Cu film 52 of 900 nm thickness, as a second conductive material film, was deposited on the $SiO_2$ film 48 including the second via hole 49 by sputtering deposition. Thereafter, the second Cu film 52 was subjected to etch back in the same way as in Example 18 until the surface of the $SiO_2$ film 48 was exposed. In this way, as shown in FIG. 10C, a second via fill 53 having the same level as the surface of the $SiO_2$ film 48 and comprising Cu was formed inside the second via hole 49 positioned on the first via fill 47.

According to Example 19, therefore, it was possible to manufacture a semiconductor device having a multilayer structure which the $SiO_2$ films 43 and 48 as the first and second interlayer dielectrics, and the $Si_3N_4$ film 57 between these $SiO_2$ films 43 and 48; in which the first via fill 47 comprising Cu and having the same level as the surface of the $SiO_2$ film 43 and the Cu wiring layer 56 were formed inside the $SiO_2$ 43; and in which the second via fill 53 having the same level as the surface of the $SiO_2$ film 48, connecting with the first via fill 47 through the through hole 58 of the $Si_3N_4$ film 57 and comprising Cu was formed inside the $SiO_2$ film 48. Concerning the semiconductor, its surface was made flat.

The surface of the Cu wiring layer 56 embedded in the $SiO_2$ film 43 as the first insulating film through the barrier layer 51, such as a TiN layer, having barrier ability against the diffusion of copper was covered with the $Si_3N_4$ 57 having barrier ability against the diffusion of copper. Therefore, it was surely possible to prevent copper of the wiring layer 56 from diffusing to the $SiO_2$ film 43 as the first insulating film, and prevent the phenomenon that copper diffuses into the $SiO_2$ film 48 as the second insulating film to reach the silicon substrate 42 via the $SiO_2$ film 43 as the first insulating film and pollute the substrate 42.

The $Si_3N_4$ film 57 having barrier ability against the diffusion of copper was formed between the $SiO_2$ films 43 and 48, as the first and second insulating films. Therefore, even if a barrier layer such as a TiN layer was not formed in the second via hole 49 in which the second via fill 53 was to be embedded, it was possible to prevent the phenomenon that copper of the second via fill 53 formed inside the $SiO_2$ 48 reached and polluted the silicon substrate 42.

EXAMPLE 20

Figure 11A:
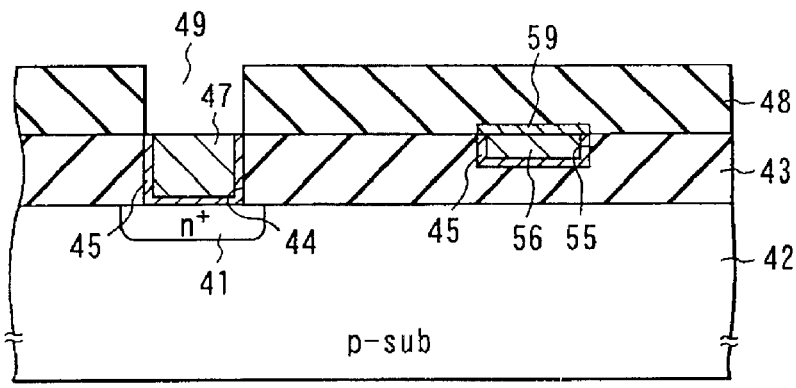
FIGS. 11A to 11C are cross sections illustrating a process for manufacturing a semiconductor device in Example 20 of the present invention.

In the same way as in Example 18, a first via fill 47 and an embedded Cu wiring layer 56 having the same level as the surface of a $SiO_2$ film 43 as a first insulating film were formed inside the $SiO_2$ film 43. As shown in FIG. 11A, thereafter, a TiN layer of 30 nm thickness was deposited on the $SiO_2$ film 43 including the first via fill 47 and the Cu wiring layer 56 by CVD. Thereafter, the TiN layer was patterned by a photo-etching technique to form a TiN barrier layer 59 on the Cu wiring layer 56 and a portion of the exposed barrier later 45 around it. Further, a $SiO_2$ film 48 of, e.g., 1000 nm, as a second insulating film, was deposited by CVD, and then a second opening (second via hole) 49 was formed in the $SiO_2$ film 48 positioned on the first via fill 37 by a photo-etching technique.

Figure 11B:
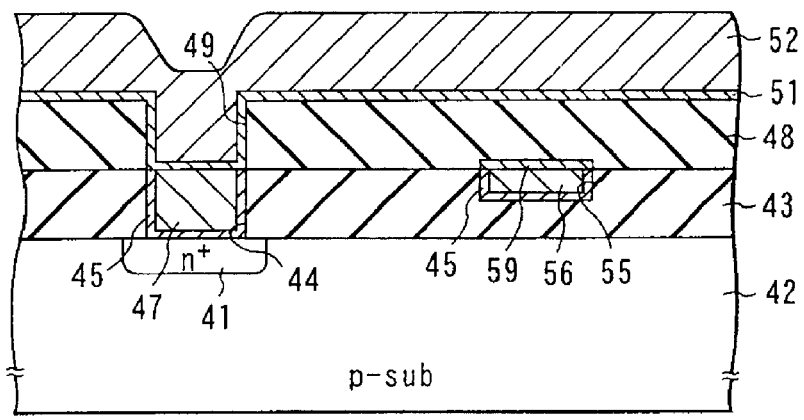
Figure 11C:
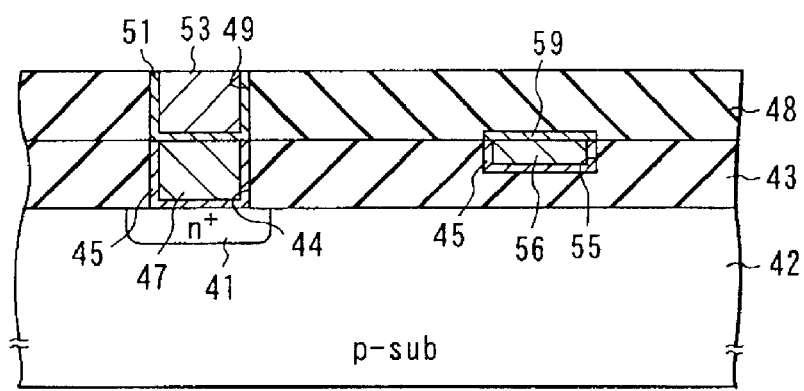

As shown in FIG. 11B, next, a conductive barrier layer 51 comprising TiN and having a thickness of 15 nm and a second Cu film 52 of 900 nm thickness, as a second conductive material film, were deposited on the $SiO_2$ film 48 including the second via hole 49 by sputtering deposition. Thereafter, the second Cu film 52 and the barrier layer 51 were subjected to etch back in the same way as in Example 18' until the surface of the $SiO_2$ film 48 was exposed. Consequently, the barrier layer 51 remained inside the second via hole 49 positioned on the first via fill 47, as shown in FIG. 10C, and additionally inside the second via hole 49 covered with the barrier layer 51 was formed a second via fill 53 having the same level as the surface of the $SiO_2$ film 48 and comprising Cu.

According to Example 20, therefore, it was possible to manufacture a semiconductor device having a multilayer structure which had the $SiO_2$ films 43 and 48 as the first and second interlayer dielectrics; and in which the first via fill 47 comprising Cu and the Cu wiring layer 56 having the same level as the surface of the $SiO_2$ film 43 were formed inside the $SiO_2$ 43; and in which the second via fill 53 having the same level as the surface of the $SiO_2$ film 48, connecting with the first via fill 47, and comprising Cu was formed inside the first via fill 47. Concerning the semiconductor, its surface was made flat.

The surface of the Cu wiring layer 56 embedded in the $SiO_2$ film 43 as the first insulating film through the barrier layer 51, such as a TiN layer, having barrier ability against the diffusion of copper was covered with the TiN barrier layer 59 having barrier ability against the diffusion of copper. Therefore, it was surely possible to prevent copper of the wiring layer 56 from diffusing to the $SiO_2$ film 48 as the first insulating film, and prevent the phenomenon that copper diffuses into the $SiO_2$ film 48 as the second insulating film to reach the silicon substrate 42 via the $SiO_2$ film 43 as the first insulating film and pollute the substrate 42.

EXAMPLE 21

Figure 12A:
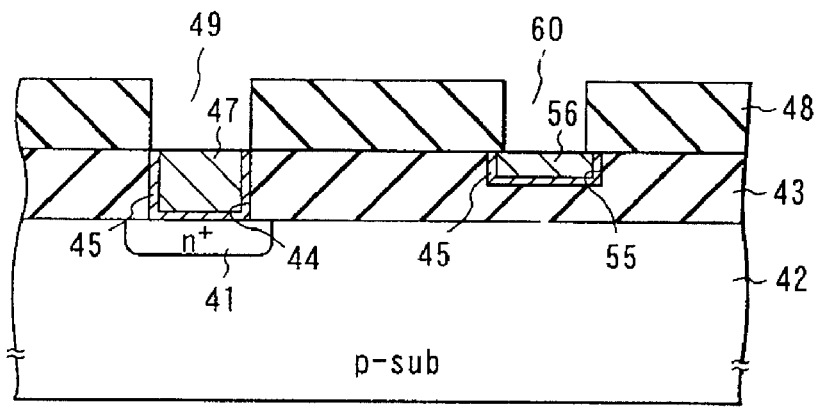
FIGS. 12A to 12C are cross sections illustrating a process for manufacturing a semiconductor device in Example 21 of the present invention.

In the same way as in Example 18, a first via fill 47 and an embedded Cu wiring layer 56 having the same level as the surface of a $SiO_2$ film 43 as a first insulating film were formed inside the $SiO_2$ film 43. As shown in FIG. 12A, thereafter, a $SiO_2$ layer 48 of, e.g., 1000 nm thickness, as a second insulating film, was deposited on the $SiO_2$ film 43 including the first via fill 47 and the Cu wiring layer 56 by CVD. Thereafter, second openings (second via holes) 49 and 60 were formed in the $SiO_2$ film 48 positioned on the first via fill 37 and the Cu wiring layer 56 by a photo-etching technique.

Figure 12B:
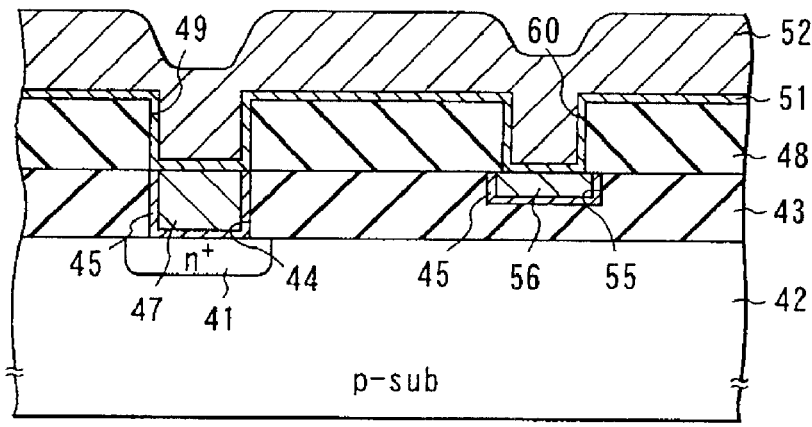
Figure 12C:
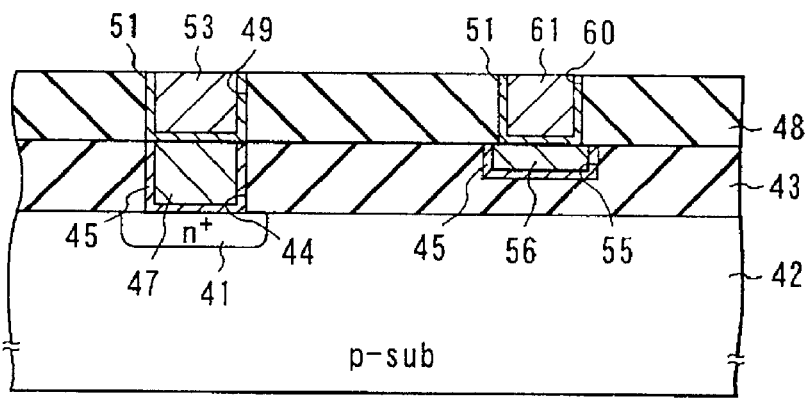

As shown in FIG. 12B, next, a conductive barrier layer 51 comprising TiN and having a thickness of 15 nm and a second Cu film 52 of 900 nm thickness, as a second conductive material film, were deposited on the $SiO_2$ film 48 including the second via holes 49 and 60 by sputtering deposition. Thereafter, the second Cu film 52 and the barrier layer 51 were subjected to etch back in the same way as in Example 18 until the surface of the $SiO_2$ film 48 was exposed. Consequently, the barrier layer 51 remained inside the second via hole 49 positioned on the first via fill 47, as shown in FIG. 12C, and additionally inside the second via hole 49 covered with the barrier layer 51 was formed a second via fill 53 having the same level as the surface of the $SiO_2$ film 48 and comprising Cu. Simultaneously, the barrier layer 51 remained inside the second via hole 60 positioned on the Cu wiring layer 56 and additionally inside the second via hole 60 covered with the barrier layer 51 was formed a second via fill 61 having the same level as the surface of the $SiO_2$ film 48 and comprising Cu.

According to Example 21, therefore, it was possible to manufacture a semiconductor device having a multilayer structure which the $SiO_2$ films 43 and 48 as the first and second interlayer dielectrics; and in which the first via fill 47 comprising Cu and the Cu wiring layer 56 having the same level as the surface of the $SiO_2$ film 43 were formed inside the $SiO_2$ 43; and in which the second via fill 53 having the same level as the surface of the $SiO_2$ film 48, connecting with the first via fill 47, and comprising Cu and the second via fill 61 connecting with the cu wiring layer 56 and comprising Cu were formed inside the $SiO_2$ film 48. Concerning the semiconductor, its surface was made flat, and Cu was prevented from diffusing from the first and second via fills 47, 53 and 61 and the wiring layer 56 by the barrier layers 45 and 51 having barrier ability against the diffusion of copper.

EXAMPLE 22

Figure 13A:
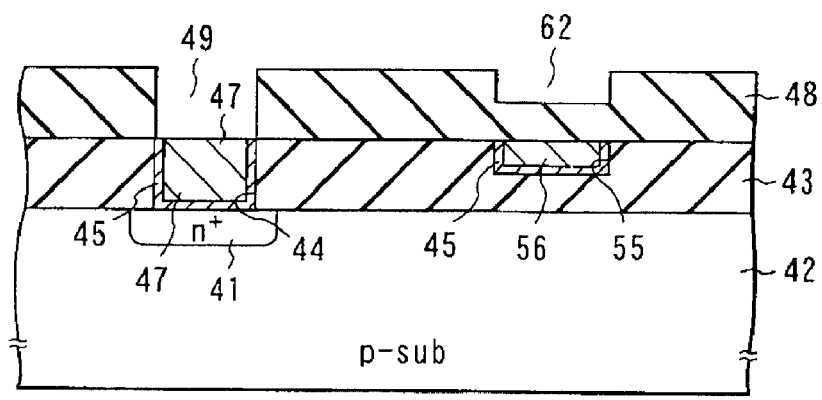
FIGS. 13A to 13C are cross sections illustrating a process for manufacturing a semiconductor device in Example 22 of the present invention.

In the same way as in Example 18, a first via fill 47 and an embedded Cu wiring layer 56 (first embedded Cu wiring layer) having the same level as the surface of a $SiO_2$ film 43 as a first insulating film were formed inside the $SiO_2$ film 43. As shown in FIG. 13A, thereafter, a $SiO_2$ layer 48 of, e.g., 1000 nm thickness, as a second insulating film, was deposited on the $SiO_2$ film 43 including the first via fill 47 and the Cu wiring layer 56 by CVD. Thereafter, second openings (second via holes) 49 and 60 were formed in the $SiO_2$ film 48 positioned on the first via fill 37 by a photo-etching technique. Further, a trench 62 corresponding to a shape of a wiring layer was made in the $SiO_2$ film 48 by a photo-etching technique.

Figure 13B:
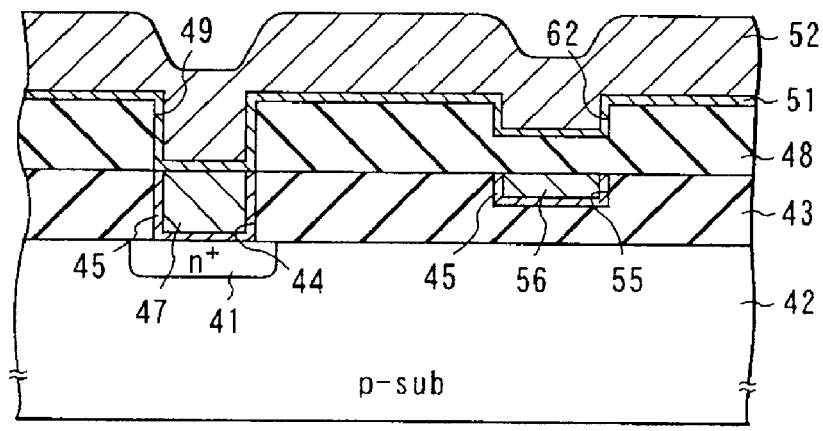
Figure 13C:
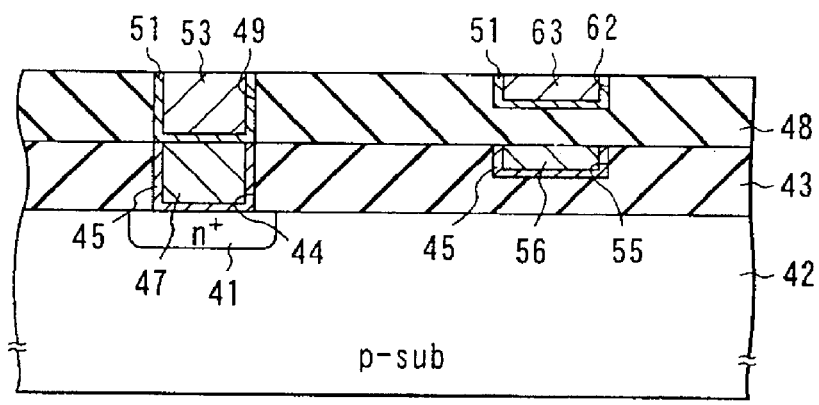

As shown in FIG. 13B, next, a conductive barrier layer 51 comprising TiN and having a thickness of 15 nm and a second Cu film 52 of 900 nm thickness, as a second conductive material film, were deposited on the $SiO_2$ film 48 including the second via hole 49 and the trench 62 by sputtering deposition. Thereafter, the second Cu film 52 and the barrier layer 51 were subjected to etch back in the same way as in Example 18 until the surface of the $SiO_2$ film 48 was exposed. Consequently, the barrier layer 51 remained inside the second via hole 49 positioned on the first via fill 47, as shown in FIG. 13C, and additionally inside the second via hole 49 covered with the barrier layer 51 was formed a second via fill 53 having the same level as the surface of the $SiO_2$ film 48 and comprising Cu. Simultaneously, the barrier layer 51 remained inside the trench 62 and additionally inside the trench 62 covered with the barrier layer 51 was formed a second Cu wiring layer 63 having the same level as the surface of the $SiO_2$ film 48.

According to Example 22, therefore, it was possible to manufacture a semiconductor device having a multilayer structure which had the $SiO_2$ films 43 and 48 as the first and second interlayer dielectrics; and in which the first via fill 47 comprising Cu and the first Cu wiring layer 56 having the same level as the surface of the $SiO_2$ film 43 were formed inside the $SiO_2$ 43; and in which the second via fill 53 having the same level as the surface of the $SiO_2$ film 48, connecting with the first via fill 47, and comprising Cu and the second Cu wiring layer 63 were formed inside the $SiO_2$ film 43. Concerning the semiconductor, its surface was made flat, and Cu was prevented from diffusing from the first and second via fills 47 and 53, and the first and second wiring layers 56 and 63 by the barrier layers 45 and 51 having barrier ability against the diffusion of copper.

EXAMPLE 23

Figure 14A:
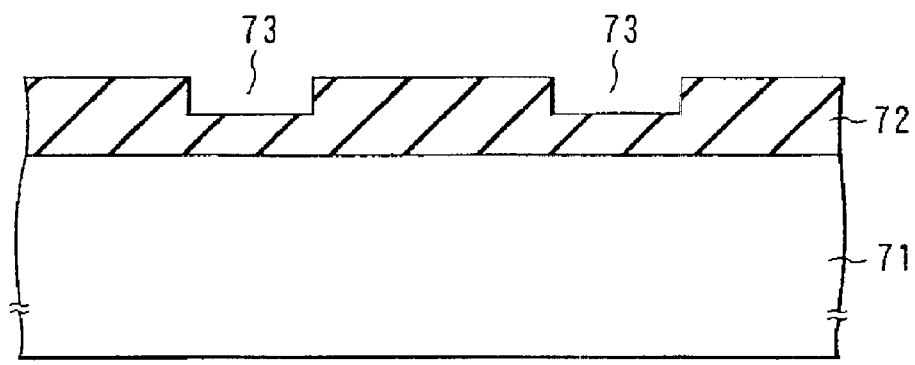
FIGS. 14A to 14F are cross sections illustrating a process for manufacturing a semiconductor device in Example 23 of the present invention.
Figure 14B:
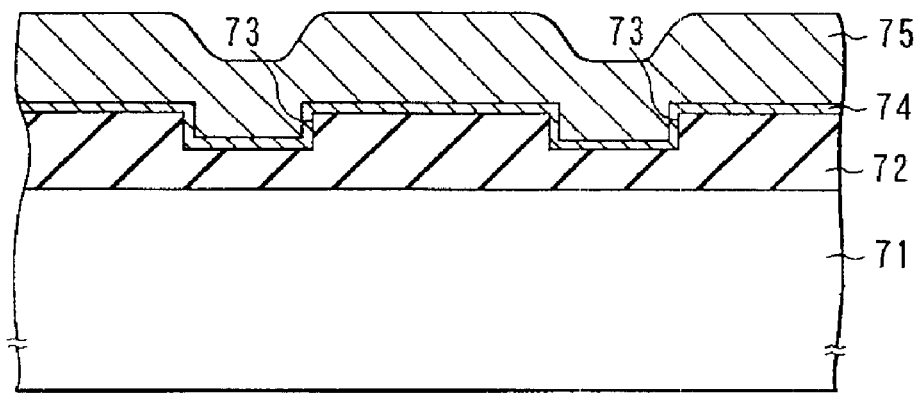

As shown in FIG. 14A, first, a $SiO_2$ film 72 of. e.g., 1100 nm thickness was deposited on a p type silicon substrate 71 having, in its surface, non-illustrated n+ type diffusion layers for source and drain regions by CVD. Thereafter, first trenches 73 corresponding to a shape of a wiring layer and a depth of 400 nm were made in the $SiO_2$ film 72 by a photo-etching technique. As shown in FIG. 14B, subsequently, a conductive barrier layer 74 comprising TiN and having a thickness of 20 nm was deposited on the $SiO_2$ film 72 including the first trenches 73 by sputtering deposition. A first Cu film 75 of 1100 nm thickness, as a first conductive material film, was then deposited by sputtering deposition.

Next, a substrate 71 shown in FIG. 14B was turned upside down and then held by the substrate holder 5 of the polishing machine shown in FIG. 3. The substrate was then pressed against the polishing pad 2 (trade name: SUBA 800, manufactured by Roder Nitta Co., Ltd.) by the supporting axial 4 of the holder 5 so as to apply a load of 300 g/cm$^2$ to the polishing pad 2. While the turn table 1 and the holder 5 were rotated at rate of 100 rpm, respectively, in the same direction, a polishing composition was supplied at a rate of 12.5 ml/minute from the supplying tube 3 to the polishing pad 2. Thus, the first Cu film 75 and the barrier layer 74 deposited on the substrate 71 were polished until the surface of the SiO$_2$ film 72 was exposed. As the polishing composition, there was used a composition comprising 0.67% by weight of 2-quinoline carboxylic acid (quinaldinic acid), 1.2% by weight of lactic acid, 0.57% by weight of ammonium dodecylsulphate, 0.4% by weight of polyvinylpyyrolidone (PVP), 13.3% by weight of hydrogen peroxide, 4.4% by weight of colloidal silica and 1.47% by weight of colloidal alumina having an average primary particle size of 20 nm, and water. In this polishing step, when the polishing composition contacted the first Cu film 75, the composition caused no etching of the film 75. In the polishing by means of the polishing pad, its polishing rate was about 1200 nm/minute. Therefore, the convex first Cu film 75 shown in FIG. 14B was preferentially polished from its surface mechanically contacting the polishing pad, and further the exposed barrier layer 74 was polished. That is, etch back was performed.

Figure 14C:
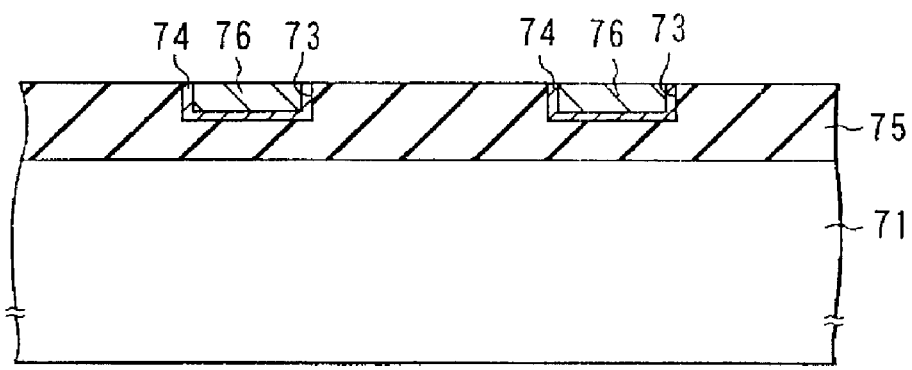

Consequently, as shown in FIG. 14C, the barrier layer 74 remained inside the first trenches 73, and additionally inside the first trenches 73 covered with the barrier layer 74 was formed a first embedded Cu wiring layer 76 having the same level as the surface of the SiO$_2$ film 72. Moreover, the above-mentioned metal polishing composition containing the surfactant had a high polishing selectivity of Cu to SiO$_2$, thereby making it possible to prevent thinning of the SiO$_2$ film 72 in the etch back step. The load to the polishing pad 2 by the holder 5 of the polishing machine was released and the rotation of the turn table 1 and the holder 5 was stopped. Thereafter, even if the first Cu wiring layer 76 was brought into contact with the polishing composition, etching did not advance. Subsequently, the substrate after the first Cu wiring layer 76 was formed was subjected to ultrasonic washing with use of pure water, to clean up the surface of the SiO$_2$ film 72.

Figure 14D:
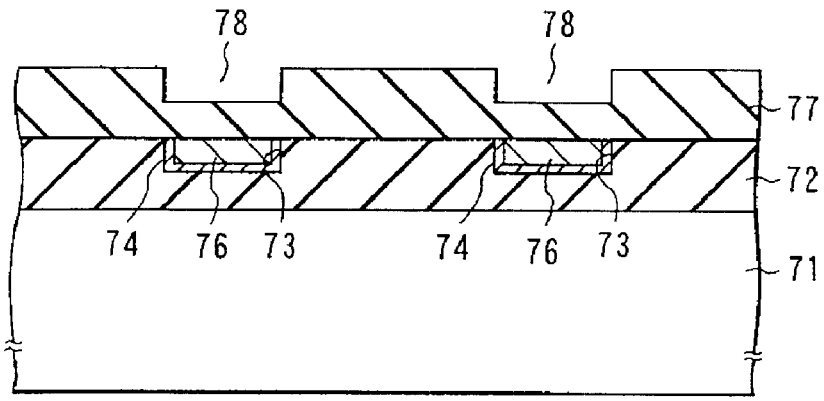
Figure 14E:
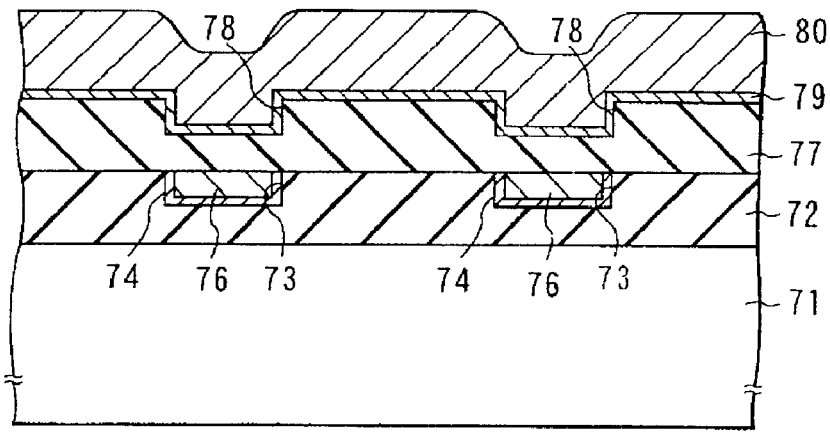

As shown in FIG. 14D, next, a SiO$_2$ film 77 of. e.g., 1000 nm thickness, as a second insulting film, was deposited on the SiO$_2$ film 72 including the first Cu wiring layer 76 by CVD. Thereafter, second trenches 78 corresponding to a shape of a wiring layer and a depth of 400 nm were formed in the SiO$_2$ film 77 by a photo-etching technique. As shown in FIG. 14E, subsequently, a conductive barrier layer 79 comprising TiN and having a thickness of 15 nm and a second Cu film 80 of 1000 nm thickness, as a second conductive material film, were deposited on the SiO$_2$ film 77 including the second trenches 78.

Next, a substrate 71 shown in FIG. 14E was turned upside down and then held by the substrate holder 5 of the polishing machine shown in FIG. 3. The substrate was then pressed against the polishing pad 2 (trade name: SUBA 800, manufactured by Roder Nitta Co., Ltd.) by the supporting axial 4 of the holder 5 so as to apply a load of 300 g/cm$^2$ to the polishing pad 2. While the turn table 1 and the holder 5 were rotated at rate of 100 rpm, respectively, in the same direction, a polishing composition was supplied at a rate of 12.5 ml/minute from the supplying tube 3 to the polishing pad 2. Thus, the second Cu film 80 and the barrier layer 79 deposited on the substrate 71 were polished until the surface of the SiO$_2$ film 77 was exposed.

Figure 14F:
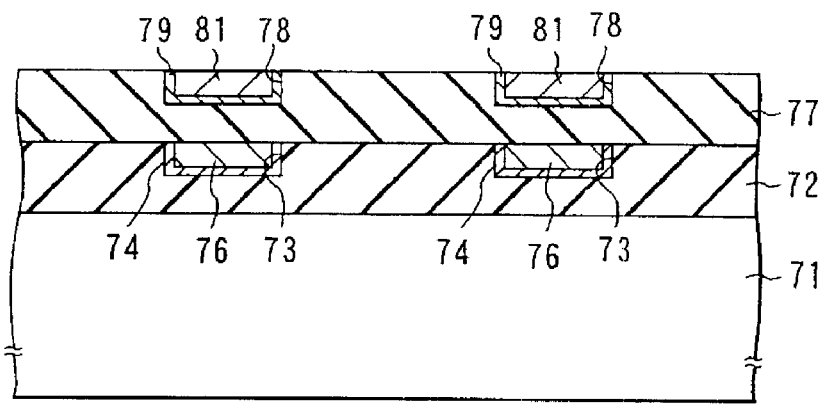

As a result, the convex second Cu film 80 shown in FIG. 14E was preferentially polished from its surface mechanically contacting the polishing pad. That is, etch back was performed. As shown in FIG. 14F, by such etch back, the barrier layer 79 remained inside the second trenches 78, and additionally inside the second trenches 78 covered with the barrier layer 79 was formed a second embedded Cu wiring layer 81 having the same level as the surface of the SiO$_2$ film 77. Moreover, the above-mentioned polishing composition containing the surfactant had a high polishing selectivity of Cu and SiO$_2$, thereby making it possible to prevent thinning of the SiO$_2$ film 77 in the etch back step. The load to the polishing pad 2 by the holder 5 of the polishing machine was released and the rotation of the turn table 1 and the holder 5 was stopped. Thereafter, even if the second Cu wiring layer 81 was brought into contact with the polishing composition, etching did not advance.

According to Example 23, therefore, it was possible to manufacture a semiconductor device having a multilayer structure which the SiO$_2$ films 72 and 77 as the first and second interlayer dielectrics; and in which the first Cu wiring layer 76 having the same level as the surface of the SiO$_2$ film 72 was formed inside the SiO$_2$ film 72; and in which the second Cu wiring layer 81 having the same level as the surface of the SiO$_2$ film 77 was formed inside the SiO$_2$ film 77. Concerning the semiconductor, its surface was made flat, and Cu was prevented from diffusing from the first and second Cu wiring layers 76 and 81 by the barrier layers 74 and 79 having barrier ability against the diffusion of copper.

EXAMPLE 24

Figure 15A:
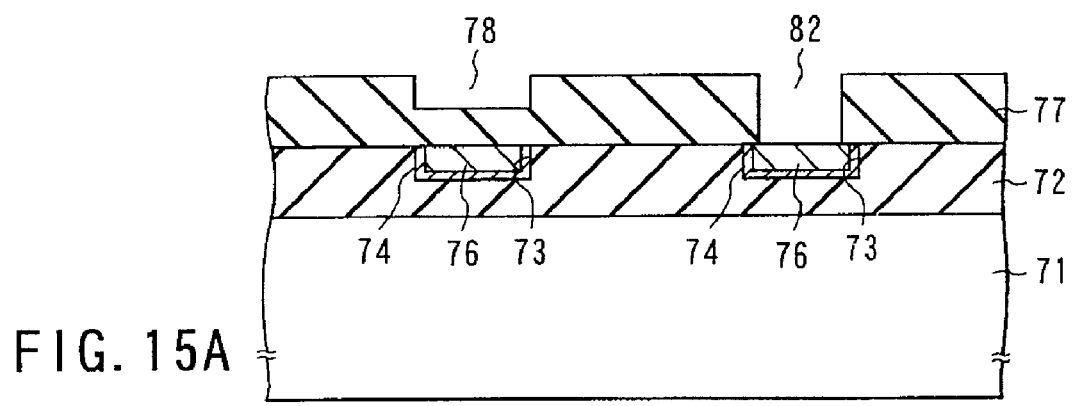
FIGS. 15A to 15C are cross sections illustrating a process for manufacturing a semiconductor device in Example 24 of the present invention.

In the same way as in Example 23, first embedded Cu wiring layers 76 having the same level as the surface of a SiO$_2$ film 72 as a first insulating film were formed inside the SiO$_2$ film 72. As shown in FIG. 15A, thereafter, a SiO$_2$ film 77 of, e.g., 1000 nm thickness, as a second insulating film, was deposited on the SiO$_2$ film 72 including the first embedded Cu wiring layers 76 by CVD. Thereafter, an opening (via hole) 82 was formed in the SiO$_2$ film 77 positioned on any ones of the first Cu wiring layers 76 by a photo-etching technique. Further, a second trench 78 corresponding to a shape of a wiring layer was formed in the SiO$_2$ film 77 by a photo-etching technique.

Figure 15B:
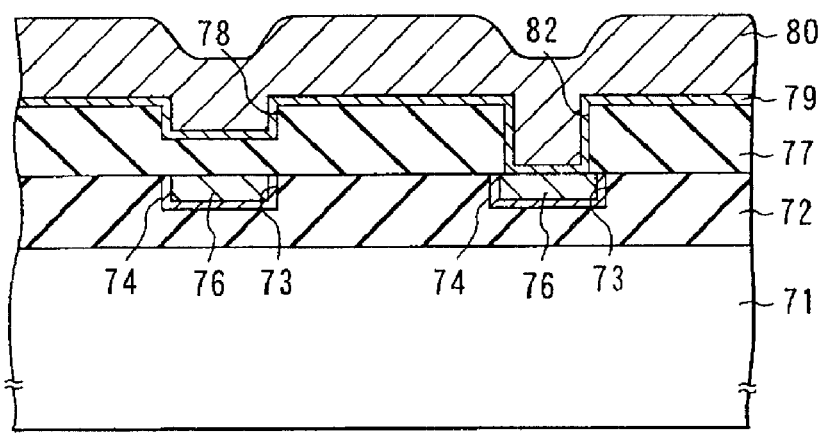
Figure 15C:
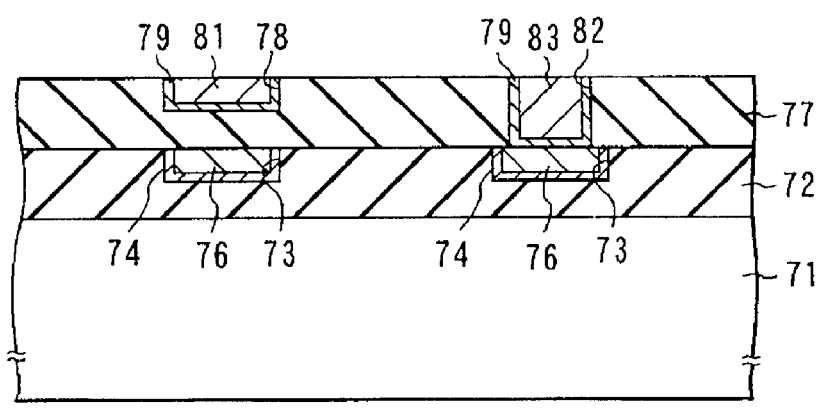

As shown in FIG. 15B, next, a conductive barrier layer 79 comprising TiN and having a thickness of 15 nm and a second Cu film 80 of 1000 nm thickness, as a second conductive material film, were deposited on the SiO$_2$ film 77 including the via hole 82 and the second trench 78 by sputtering deposition. Thereafter, the second Cu film 80 and the barrier layer 79 were subjected to etch back in the same way as in Example 23 until the surface of the SiO$_2$ film 77 was exposed. Consequently, the barrier layer 79 remained inside the via hole 82 positioned on the first Cu wiring layers 76, as shown in FIG. 15C, and additionally inside the via hole 82 covered with the barrier layer 79 was formed a via fill 83 having the same level as the surface of the SiO$_2$ film 77 and comprising Cu. Simultaneously, the barrier layer 79 remained inside the second trench 78 and additionally inside the second trench 78 covered with the barrier layer 79 was formed a second Cu wiring layer 81 having the same level as the surface of the SiO$_2$ film 77.

According to Example 24, therefore, it was possible to manufacture a semiconductor device having a multilayer structure which had the SiO$_2$ films 72 and 77 as the first and second interlayer dielectrics; and in which the first Cu wiring layer 76 having the same level as the surface of the SiO$_2$ film 72 was formed inside the SiO$_2$ film 72; and in which the second Cu wiring layer 81 and the via fill 83 having the same level as the surface of the SiO$_2$ film 77, connecting with the first Cu wiring layers and comprising Cu were formed inside the SiO$_2$ film 77. Concerning the semiconductor, its surface was made flat, and Cu was prevented from diffusing from the first and second Cu wiring layers 76 and 81 and the via fill 83 comprising Cu by the barrier layers 74 and 79 having barrier ability against the diffusion of copper.

In the above-mentioned Examples, the silicon oxide or silicon nitride film was used as the interlayer dielectric, but a film comprising an insulating material having a dielectric constant of 3.5 or less, such as SiOF or an organic material spin-on glass may be used. By using the insulating film having such a dielectric constant, it was possible to raise the signal-transmission-speed of the Cu wiring layer embedded in this insulating film.

In the above-mentioned Examples, 2-quinoline carboxylic acid was used as the water-soluble first organic acid capable of reaction with copper to produce a copper complex compound which is substantially insoluble in water and has a mechanical strength lower than that of copper in the copper-based polishing composition, but in the case of using 2-pyridine carboxylic acid, 2,6-pyridine carboxylic acid, quinone or the like, Cu or Cu alloy was not dissolved in the polishing composition at all when the polishing composition was immersed in the Cu or Cu alloy. In polishing, the Cu film was able to be polished at a practical rate.

In the case of using oxalic acid, tartaric acid, mandelic acid or malic acid instead of lactic acid as the second organic acid in the copper-based polishing composition in Examples 13 to 24, the Cu film was able to be polished at a practical rate in polishing.

When conductive members such as via fills in the first and second insulating films were formed in the manufacture of the semiconductor devices having a multilayer wiring structure in Examples 17 to 24, the copper-based polishing compositions having the same components and the same composition were used, but copper-based polishing compositions having different components and different compositions may be used.

In Examples 22 to 24, after the formation of the first Cu wiring layer, a silicon nitride film having barrier ability against the diffusion of copper may be formed on the first insulating film including this Cu wiring layer in the same way as in Example 20. By depositing such a silicon nitride, it is surely possible to prevent the phenomenon that Cu diffuses from the surface of the first Cu wiring layer to reach and pollute the silicon substrate.

As described above, according to the present invention, provided is a copper-based polishing composition causing copper (Cu) or copper alloy (Cu alloy) not to be dissolved in immersing Cu or Cu alloy, and causing Cu or Cu alloy to be polished at a practical rate in polishing treatment.

Moreover, according to the present invention, provided is a method for manufacturing a semiconductor device which makes it possible to form a conductive member, such as a high-precision embedded wiring layer, which can be etched back for a short time by polishing after at least one member for embedment selected from a trench and an opening is formed in an insulating film on a semiconductor substrate and then a conductive material film comprising Cu or Cu alloy is formed on the insulating film.

Furthermore, according to the present invention, provided is a method for manufacturing a semiconductor device which makes it possible to form a conductive member, such as a high-precision embedded wiring layer, which can be etched back for a short time, by polishing after at least one member for embedment selected from a trench and an opening is formed in an insulating film on a semiconductor substrate and then a conductive material film comprising Cu or Cu alloy is formed on the insulating film, and further which makes it possible to suppress thinning of the insulating film in the etch back step, thereby manufacturing a semiconductor device having a flat surface and an excellent breakdown voltage.

In addition, according to the present invention, provided is a polishing composition making it possible to polish a metal film, and suppress generation of injuries on the polished surface.

Additionally, according to the present invention, provided is a method for manufacturing a semiconductor device which makes it possible to form a conductive member, such as a high-precision embedded wiring layer having a surface having a few polishing injuries, which can be etched back for a short time by polishing after at least one member for embedment selected from a trench and an opening is formed in an insulating film on a semiconductor substrate and then a conductive material film comprising Cu or Cu alloy is formed on the insulating film.

Also, according to the present invention, provided is a polishing composition making it possible to polish a metal film comprising Cu or the like at a practical rate, and suppress generation of injuries on the polished surface.

Furthermore, according to the present invention, provided is a method for manufacturing a semiconductor device which makes it possible to form a wiring which can be etched back for a short time and which has a high-precision dual damascene structure by polishing after a trench and an opening are made in an insulating film on a semiconductor substrate and then a conductive material film comprising copper or copper alloy is formed on the insulating film.

Besides, according to the present invention, provided is a method for manufacturing a semiconductor device which makes it possible to form a high-precision multilayer wiring made mainly of copper by etch back for a short time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A copper-based metal polishing composition, comprising at least one first organic acid selected from the group consisting of 2-quinoline carboxylic acid, 2-pyridine carboxylic acid and 2,6-pyridine carboxylic acid;

at least one second organic acid selected from the group consisting of oxalic acid and an organic acid having a single carboxyl group and a single hydroxyl group, the second organic acid being contained in an amount of 20 to 250% by weight of the first organic acid;

an abrasive grain;

an oxidizing agent; and water.

2. The polishing composition according to claim 1, wherein said organic acid having the single carboxyl group and the single hydroxyl group is lactic acid.

3. The polishing composition according to claim 1, wherein said abrasive grain is at least one selected from the group consisting of silica, zirconia, cerium oxide and alumina.

4. The polishing composition according to claim 1, wherein said oxidizing agent is hydrogen peroxide.

5. The polishing composition according to claim 1, which further comprises a surfactant.

6. The polishing composition according to claim 1, which further comprises a dispersing agent for the abrasive grain.

7. The copper-based metal polishing composition according to claim 1, the second organic acid is contained in an amount of 40 to 200% by weight of the first organic acid.

* * * * *